United States Patent
Zweigle et al.

(10) Patent No.: US 7,630,863 B2
(45) Date of Patent: Dec. 8, 2009

(54) APPARATUS, METHOD, AND SYSTEM FOR WIDE-AREA PROTECTION AND CONTROL USING POWER SYSTEM DATA HAVING A TIME COMPONENT ASSOCIATED THEREWITH

(75) Inventors: Gregory C. Zweigle, Pullman, WA (US); Armando Guzman-Casillas, Pullman, WA (US); Charles E. Petras, Pullman, WA (US); Ping Jiang, Redmond, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

(21) Appl. No.: 11/857,427

(22) Filed: Sep. 18, 2007

(65) Prior Publication Data

US 2008/0071482 A1    Mar. 20, 2008

Related U.S. Application Data

(60) Provisional application No. 60/845,744, filed on Sep. 19, 2006.

(51) Int. Cl.
*G06F 3/00* (2006.01)

(52) U.S. Cl. .............. 702/188; 702/177; 702/187; 702/189

(58) Field of Classification Search .......... 702/57, 702/60, 62, 64, 65, 179, 182, 188, 177, 187, 702/189; 324/76.11; 340/635; 700/295; 705/26

See application file for complete search history.

(56) References Cited

U.S. PATENT DOCUMENTS

| | | |
|---|---|---|
| 4,719,469 A | 1/1988 | Beier |
| 4,821,294 A | 4/1989 | Thomas |
| 4,829,298 A | 5/1989 | Fernandes |
| 5,006,846 A | 4/1991 | Granville |
| 5,224,011 A | 6/1993 | Yalla |
| 5,446,682 A | 8/1995 | Janke |

(Continued)

FOREIGN PATENT DOCUMENTS

EP    1324454 A1    7/2003

(Continued)

OTHER PUBLICATIONS

IEEE Xplore 2.0: Comparative Testing Of Synchronized Phasor Measurement Units by Juancarlo Depablos, Virgilio Centeno, Arun G. Phadke and Michael Ingram; httb://ieeexplore.ieee.org/spl/freeabs_all.isp?arnumber=1372972.

(Continued)

*Primary Examiner*—Eliseo Ramos Feliciano
*Assistant Examiner*—Felix E Suarez
(74) *Attorney, Agent, or Firm*—Eugene M. Cummings, P.C.

(57) ABSTRACT

An apparatus, system and method in an electrical system using power system information or data associated therewith having a time component associated therewith sampled or obtained from the electrical system at a local and a remote location, wherein the local and remote data are time aligned and used to provide control, monitoring, metering, and/or automation to the electrical system. The local IED may be adapted to receive power system data from the remote IED, time align the local and remote synchronized power system data, and perform math operations on the local and remote power system data.

24 Claims, 15 Drawing Sheets

U.S. PATENT DOCUMENTS

| | | | |
|---|---|---|---|
| 5,498,956 | A | 3/1996 | Kinney |
| 5,592,393 | A | 1/1997 | Yalla |
| 5,736,961 | A | 4/1998 | Fenton |
| 5,963,582 | A | 10/1999 | Stansell |
| 5,995,911 | A | 11/1999 | Hart |
| 6,075,987 | A | 6/2000 | Camp |
| 6,104,729 | A | 8/2000 | Hellum |
| 6,127,970 | A | 10/2000 | Lin |
| 6,141,196 | A | 10/2000 | Premerlani |
| 6,160,841 | A | 12/2000 | Stansell |
| 6,236,949 | B1 | 5/2001 | Hart |
| 6,252,863 | B1 | 6/2001 | Raby |
| 6,313,934 | B1 | 11/2001 | Fortenberry |
| 6,429,785 | B1 | 8/2002 | Griffin |
| 6,446,682 | B1 | 9/2002 | Viken |
| 6,570,534 | B2 | 5/2003 | Cohen |
| 6,618,648 | B1 | 9/2003 | Shirota |
| 6,642,700 | B2 | 11/2003 | Slade |
| 6,662,124 | B2 | 12/2003 | Schweitzer |
| 6,671,654 | B1 * | 12/2003 | Forth et al. ............ 702/182 |
| 6,687,627 | B1 * | 2/2004 | Gunn et al. ............. 702/61 |
| 6,694,270 | B2 | 2/2004 | Hart |
| 6,735,523 | B1 | 5/2004 | Lin |
| 6,735,535 | B1 | 5/2004 | Kagan |
| 6,745,175 | B2 | 6/2004 | Pierce |
| 6,751,653 | B2 | 6/2004 | Austin |
| 6,754,597 | B2 | 6/2004 | Bertsch |
| 6,762,714 | B2 | 7/2004 | Cohen |
| 6,845,301 | B2 | 1/2005 | Hamamatsu |
| 6,845,333 | B2 * | 1/2005 | Anderson et al. ............. 702/65 |
| 6,853,978 | B2 * | 2/2005 | Forth et al. ............. 705/26 |
| 6,859,742 | B2 | 2/2005 | Randall |
| 6,944,555 | B2 * | 9/2005 | Blackett et al. ............. 702/62 |
| 6,983,393 | B2 | 1/2006 | Truchard |
| 2003/0220752 | A1 | 11/2003 | Hart |
| 2004/0059469 | A1 | 3/2004 | Hart |
| 2004/0093177 | A1 | 5/2004 | Schweitzer |
| 2006/0029105 | A1 | 2/2006 | Kasztenny |

FOREIGN PATENT DOCUMENTS

| | | |
|---|---|---|
| EP | 1324455 A1 | 7/2003 |
| EP | 1324455 B1 | 2/2005 |
| EP | 1324454 B1 | 5/2006 |
| WO | WO 03055028 | 7/2003 |

OTHER PUBLICATIONS

R.O. Burnett, Jr., M.M. Butts, T.W. Cease, V. Centeno, G. Michel, R. J. Murphy, A. G. Phadke-Synchronized Phasor Measurements of a Power System Event-IEEE Transactions on Power Systems dated Aug. 3, 1994 (pp. 1643-1650; vol. 9, No. 3).

Mark Adamiak, Dr. William Premerani, Dr. Bogdan Kasztenny-Synchrophasors: Definition, Measurement, and Application-Power Systems 2005 Conference, Marden Center, Clemson University, Mar. 8-11, 2005 dated Mar. 11, 2005.

Rafael San Vincente, Raul Cortes, Jaime Robles, J. Enrique Chong-Quero-DSP-Microcontroller Implementations of a Simplified Algorithm for Synchrophasor Calculation-2nd International Conference on Electrical and Electronics Engineering (ICEEE) and XI Conference on Electrical Engineering (CIE 2005), Mexico City, Mexico, Sep. 7-9, 2005 (pp. 408-411; IEEE Catalog No. 05EX1097).

Tsuyoshi Funaki, Shunsuke Tanaka-Error Estimation and Correction of DFT in Synchronized Phasor Measurement-Transmission and Distribution Conference and Exhibition 2002: Asia Pacific, IEEE/PES dated Aug. 6, 2002 (pp. 448-453, vol. 1).

A.G. Phadke-Synchronized Phasor Measurements-A Historical Overview-Transmission and Distribution Conference and Exhibition 2002: Asia Pacific, IEEE/PES dated Aug. 6, 2002 (pp. 476-479, vol. 1).

Jian Li, Xiaorong Xie, Jinyu Xiao; Jingtao Wu-The Framework and Algorithm of a New Phasor Measurement Unit-2004 IEEE International Conference on Electric Utility Deregulation, Restructuring and Power Technologies (DROT2004) Apr. 2004 Hong Kong dated Apr. 5, 2004 (pp. 826-831, vol. 2).

Yutaka Ota, Hiroyuki Ukai, Koichi Nakamura, Hideki Fujita-Evaluation of Stability and Electric Power Quality in Power System by Using Phasor Measurements-Power System Technology, 2000. Proceedings. PowerCon 2000. International Conference dated Dec. 4, 2000 (pp. 1335-1340, vol. 3).

A.G. Phadke-Synchronized Phasor Measurements in Power Systems-IEEE Computer Applications in Power dated Apr. 1993 (vol. 6).

Gabriel Benmouyal, E.O. Schweitzer, A. Guzman-Synchronized Phasor Measurement in Protective Relays for Protection, Control, and Analysis of Electric Power Systems-$29^{th}$ Annual Western Protective Relay Conference Spokane, Washington, Oct. 22-24, 2002 (also available at http://www.selinc.com/techpprs/6139.pdf).

National Instruments-Synchronizing and Correlating Measurements to a Global Timebase with GPS; http://zone.ni.com/devzone/cda/tut/p/id/4202 (visited on Sep. 7, 2006).

Enrique Martinez, Nicolas Juarex, Armando Guzman, Greg Zweigle, Jean Leon-Using Synchronized Phasor Angle Difference for Wide-Area Protection and Control; http://www.selinc.com/techpprs/TP6254_UsingSynchronizedPhasor_20060922.pdf dated Sep. 22, 2006.

ABB-Wide Area Measurement, Monitoring, Protection and Control Industrial IT for Energy System Operation-http://library.abb.com/GLOBAL/SCOT/scot221.nsf/VerityDisplay/E1755E3F1F32890EC1256E3F0041D8F4/$File/741_PSG_Basic_rev3_A4_US_CH.pdf (2003).

Patent Cooperation Treaty; From the International Bureau; Date of Mailing Apr. 2, 2009; PCT/US2007/020277; Notification Concerning Transmittal Of Copy Of International Preliminary Report On Patentability (Chapter I Of The Patent Cooperation Treaty); International Filing Date Sep. 19, 2007; Applicant: Schweitzer Engineering Laboratories, Inc.

* cited by examiner

```
=>>Cmet Crpm
Relay 1                                      900                Date: 08/30/2006  Time: 09:19:26.000
Station A                                                       Serial Number: 2005339297

PMDOKT: 1   ROKRPM: 1    PMDOK: 1    TSOK: 1    PMDOK(remote): 1    TSOK(remote): 1

Local Synchrophasors
                    Phase Voltages                      Pos.-Sequence Voltage
              VA          VB          VC                       V1
MAG (kV)    197.476     197.560     197.516                 197.517
ANG (DEG)    55.477     -64.524     175.509                  55.487

IW Phase Currents                      IW Pos.-Sequence Current
              IA          IB          IC                       I1W
MAG (A)      64.419      62.853      62.384                  63.216
ANG (DEG)  -120.670     120.454       0.539                 -119.900

IX Phase Currents                      IX Pos.-Sequence Current
              IA          IB          IC                       I1X
MAG (A)       1.846       0.122       1.822                   1.161
ANG (DEG)   -39.565      22.742      58.595                  -50.871

IS Phase Currents                      IS Pos.-Sequence Current
              IA          IB          IC                       I1S
MAG (A)      64.730      62.837      63.367                  63.640
ANG (DEG)  -119.056     120.343       1.937                 -118.924

FREQUENCY (Hz) 60.000
Rate-of-change of FREQUENCY (Hz/s)   0.00

Digitals

PSV40  PSV39  PSV38  PSV37  PSV36  PSV35  PSV34  PSV33
  0      0      0      0      0      0      0      0
PSV48  PSV47  PSV46  PSV45  PSV44  PSV43  PSV42  PSV41
  0      0      0      0      0      0      0      0
PSV56  PSV55  PSV54  PSV53  PSV52  PSV51  PSV50  PSV49
  0      0      0      0      0      0      0      0
PSV64  PSV63  PSV62  PSV61  PSV60  PSV59  PSV58  PSV57
  0      0      0      0      0      0      0      0

Analogs

PMV57   2338.750    PMV58   154.958    PMV59   2308.760    PMV60   153.053
PMV61     51.381    PMV62    41.947    PMV63    110.347    PMV64   205.781
------------------------------------------------------------------------
Remote Synchrophasors
                    Phase Voltages                      Pos.-Sequence Voltage
              VA          VB          VC                       V1
MAG (kV)    197.905     197.931     197.901                 197.912
ANG (DEG)    62.636     -57.364    -177.334                  62.646

Phase Currents                      Pos.-Sequence Current
              IA          IB          IC                       I1
MAG (A)      62.051      65.682      65.461                  64.397
ANG (DEG)    67.120     -53.658    -173.635                  66.600

REMOTE FREQ (Hz) 60.000
Digitals

PSV51  PSV50  PSV49
  0      1      1
PSV64  PSV63  PSV62  PSV61  PSV60  PSV59  PSV58  PSV57
  0      0      0      0      0      0      0      0
=>>
```

FIG 14

APPARATUS, METHOD, AND SYSTEM FOR WIDE-AREA PROTECTION AND CONTROL USING POWER SYSTEM DATA HAVING A TIME COMPONENT ASSOCIATED THEREWITH

CROSS-REFERENCE TO RELATED APPLICATIONS

This application claims benefit under 35 U.S.C. §119(e) of U.S. Provisional Application Ser. No. 60/845,744, entitled "An Apparatus, Method, and System for Wide-Area Protection and Control Using Synchronized Phasors," filed Sep. 19, 2006, naming Gregory C. Zweigle, Armando Guzman-Casillas, Ping Jiang and Charles E. Petras as inventors, the complete disclosure thereof being incorporated herein by reference.

FIELD OF THE INVENTION

This invention relates generally to apparatuses, methods, and systems for protection and control using power system data having a time component associated therewith. More specifically, this invention relates to apparatuses, methods, and systems for communicating power system data having a time component associated therewith between intelligent electronic devices for providing real-time automation, protection and control to electric power systems.

BACKGROUND OF THE INVENTION

System-wide protection, control, automation, metering, and monitoring of power transmission and distribution often requires the sharing of power system data among a plurality intelligent electronic devices (IEDs). A common reference point such as time is generally included, so that such data from the various IEDs may be properly compared.

For example, U.S. Pat. Nos. 6,845,333 and 6,662,124 (herein incorporated by reference) describe a relay system that obtains voltage and current values from a power line and uses a first sampling element to sample voltage and current signals at selected intervals of time. The resulting sampled signals are used for power system-wide protection, control, monitoring and metering. The sampled signals are then resampled at a rate that is a selected multiple of the power system frequency. The results of the resampling are used by processing circuitry to create processed power system data for protection functions including fault determinations.

In order to provide wide area protection, control, and monitoring systems, data (e.g., phasor data) associated with a power system acquired from the individual intelligent electronic devices (IEDs) is typically collected by a central processing unit where the data is stored (e.g., in non-volatile memory) and processed (e.g. resampled, time aligned, etc.) before being used in control, protection and monitoring logic, from which a control or protection command may be given. The result is that many of these existing systems require about 700 milliseconds before a control or protection command is issued.

Accordingly, one object of the present invention is to reduce the amount of time before a control or protection command may be issued.

Further, it is another object of the present invention to reduce the number of IEDs and central processing units (CPUs) needed in a wide area protection, control and monitoring system.

SUMMARY OF THE INVENTION

Provided is a system for power system automation, control or protection using power system data having a time component associated therewith from a plurality of intelligent electronic devices (IEDs). The system generally includes a remote and local IED. The remote IED is generally associated with a remote location on a power line and is adapted to acquire remote power system signals. The remote IED further calculates remote power system data from the acquired power system signals and associates the remote power system data with a time stamp to produce time-stamped remote power system data. The resulting time-stamped remote power system data is transmitted to the local IED. The local IED is associated with a location on a power line and adapted to acquire local power system signals. The local IED calculates local power system data from the sampled power system signals; receives the time-stamped remote power system data; and time-aligns the local power system data with the time-stamped remote power system data. The local IED is further adapted to perform a real-time automation, control or protection operations using the time-aligned local power system data and the time-stamped remote power system data.

In one embodiment, the power system data is phasor data.

In yet another embodiment, provided is a method for providing protection, control and monitoring to an electric power system. The method generally includes the steps of acquiring remote power system signals at remote locations; calculating remote power system data from the acquired remote power system signals; associating the remote power system data with a time value to produce time-stamped remote power system data; transmitting the time-stamped remote power system data to a local location; receiving the time-stamped remote power system data at the local location; acquiring local power system signals; calculating local power system data from the sampled local power system signals; time-aligning the local power system data with the time-stamped remote power system data; and performing real-time automation, protection or control functions using the time-aligned local power system data and the time-stamped remote power system data.

In yet another aspect of the present invention, provided is an apparatus for providing protection, monitoring and control for an electric power system. The apparatus generally comprises an acquisition circuit for obtaining local analog signals from an electric power system; a sampling circuit for sampling the local analog signals; a communication channel for transmitting messages containing local power system data calculated from the local analog signals to a remote device; a communication channel for receiving messages containing remote power system data from the remote device; a time alignment function for time aligning the local power system data with the remote power system data, and a real-time operation function for providing protection, automation, metering, or control of the power system based on the time aligned local power system data and remote power system data.

In yet another embodiment, provided is a system for power system automation, control or protection using power system data having a time component associated therewith from a plurality of intelligent electronic devices (IEDs). The system generally includes a plurality of IEDs associated with locations on a power line, the plurality of IEDs adapted to acquire power system signals, and which calculate power system data from the acquired power system signals, associate the power system data with a time stamp to produce time-stamped power system data, and transmit the time-stamped power system data; and a real-time controller adapted to receive the time-stamped power system data from the plurality of IEDs, time-aligns the time-stamped power system data, performs a real-time automation, control or protection operations using the time-aligned power system data, and transmits messages associated with results of the automation, control or protection operations to at least one of the plurality of IEDs.

BRIEF DESCRIPTION OF THE DRAWINGS

FIG. 14 is a phasor measurement report according to an embodiment of the present invention.

DESCRIPTION OF THE PREFERRED EMBODIMENTS

The present invention provides a method, apparatus, and system for power system protection, control and monitoring of an electrical power transmission or distribution system by comparing power system data having a time component associated therewith from disparate points on the electrical power transmission or distribution system. As will be described in more detail herein, a benefit of the present invention is that the comparison of the power system data takes place at or near to the real-time collection of the data. The system, apparatus, and method of the present invention also require fewer IEDs and CPUs for adequate processing and comparison of the data associated with power system information.

Throughout, the term "IED" or "intelligent electronic device" is to include, but not be limited to, any intelligent electronic device, such as, for example, a central processing unit (CPU), relay, phase measurement unit (PMU), phase measurement and control unit (PMCU), phasor data concentrator (PDC), wide area control system (WACS), wide area protection system (WAPS), and so forth.

Figure 1:
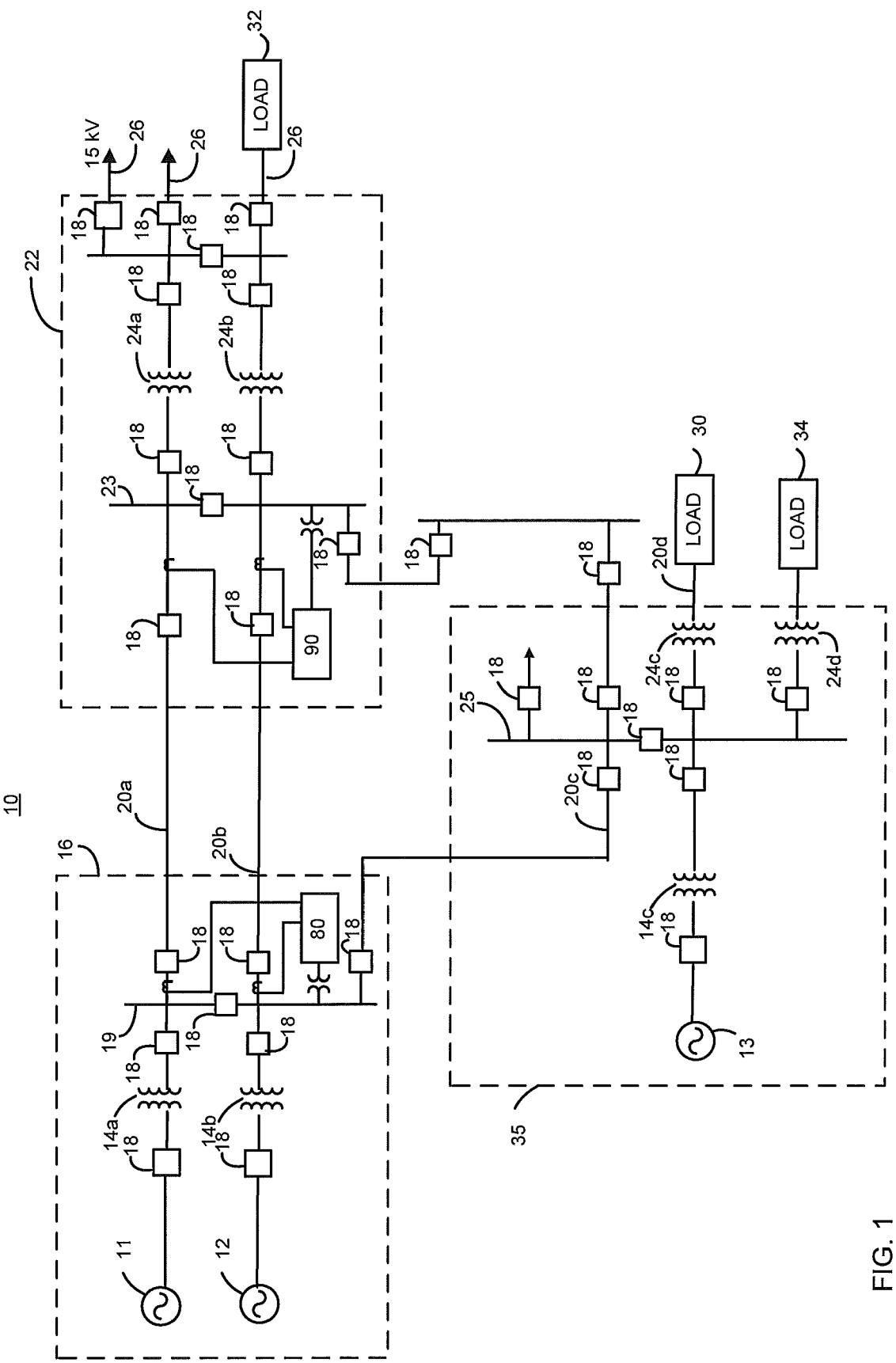
FIG. 1 is a single line schematic of a power system that may be utilized in a typical wide area network.

FIG. 1 illustrates a single line schematic of a power system that may be utilized in a typical wide area network. As illustrated in FIG. 1, the power system 10 includes, among other things, three synchronous generators 11, 12 and 13, configured to generate three-phase voltage sinusoidal waveforms such as 12 kV sinusoidal waveforms, three step-up power transformers 14a, 14b and 14c, configured to increase the generated voltage sinusoidal waveforms to higher voltage sinusoidal waveforms such as 138 kV sinusoidal waveforms and a number of circuit breakers 18. The step-up power transformers 14a, 14b, 14c operate to provide the higher voltage sinusoidal waveforms to a number of long distance transmission lines such as the transmission lines 20a, 20b, and 20c. In an embodiment, a first substation 16 may be defined to include the two synchronous generators 11 and 12, the two step-up power transformers 14a and 14b and associated circuit breakers 18, all interconnected via a first bus 19. A second substation 35 may be defined to include the synchronous generator 13, the step-up power transformer 14c and associated circuit breakers 18, all interconnected via a second bus 25. At the end of the long distance transmission lines 20a, 20b, a third substation 22 may be defined to include two step-down power transformers 24a and 24b configured to transform the higher voltage sinusoidal waveforms to lower voltage sinusoidal waveforms (e.g., 15 kV) suitable for distribution via one or more distribution lines 26 to loads such as a load 32. The second substation 35 also includes two step-down power transformers 24c and 24d to transform the higher voltage sinusoidal waveforms, received via the second bus 25, to lower voltage sinusoidal waveforms suitable for use by respective loads 30 and 34.

A number of IEDs are connected at various points in the electric power system 10. For ease of discussion however, one local IED 80 is shown operatively connected to the transmission line 20b via instrument transformers (such as current transformers and voltage transformers), and one remote IED 90 is shown operatively connected to the transmission line 20b via instrument transformers. The local and remote IEDs 80 and 90 may be separated by a distance. In general, an IED can be configured to perform one or more of power system protection (e.g., a line current differential protection, line distance protection), automation (e.g., reclosing a circuit breaker), control (e.g., capacitor bank switching) and metering (e.g., power consumption calculation) functions.

The local and remote IEDs 80 and 90 may be any device capable of acquiring power system signals (e.g., voltage and current signals) and communicating power system data along with power system information. The local and remote IEDs 80 and 90 communicate over a communications channel, such as a serial or Ethernet port. In one embodiment, the local and remote IEDs 80 and 90 are identical, and perform the same functions on data received from each other. However, for simplicity, the functions of each IED will be discussed in terms of the local and remote IEDs 80 and 90.

Each IED 80 and 90 may collect power system signals from the power line 20b such as three phases of current ($I_A$, $I_B$, and $I_C$), three phases of voltage ($V_A$, $V_B$, and $V_C$), and any combination of the phase quantities (e.g. symmetrical components, Clarke components, and the like). For simplicity, the following discussion will focus on a single phase.

The communication between the local and remote IED 80 and 90 may also include unsolicited binary messages. These messages may include information such as: power system information, data associated with the power system information, configuration, IED information, IED configuration settings, substation configuration, voltage values; current values; time stamp information to align the local and remote synchrophasor values 216 and 218; and the like. The time stamp information is derived from a common time reference, for example, based on GPS distributed time, between IED 80 and 90. Each IED 80 and 90 may use the data communicated from the other IED to affect a control, automation, command or message. For example, the local IED 80 aligns and compares the local voltage angle ($V_{ALS}$) with the remote voltage angle ($V_{ARS}$) to obtain an angle difference between the two points on the conductor 20b. This angle difference can then be used by the relay logic to perform control or protection functions with fixed or programmable logic.

Figure 2:
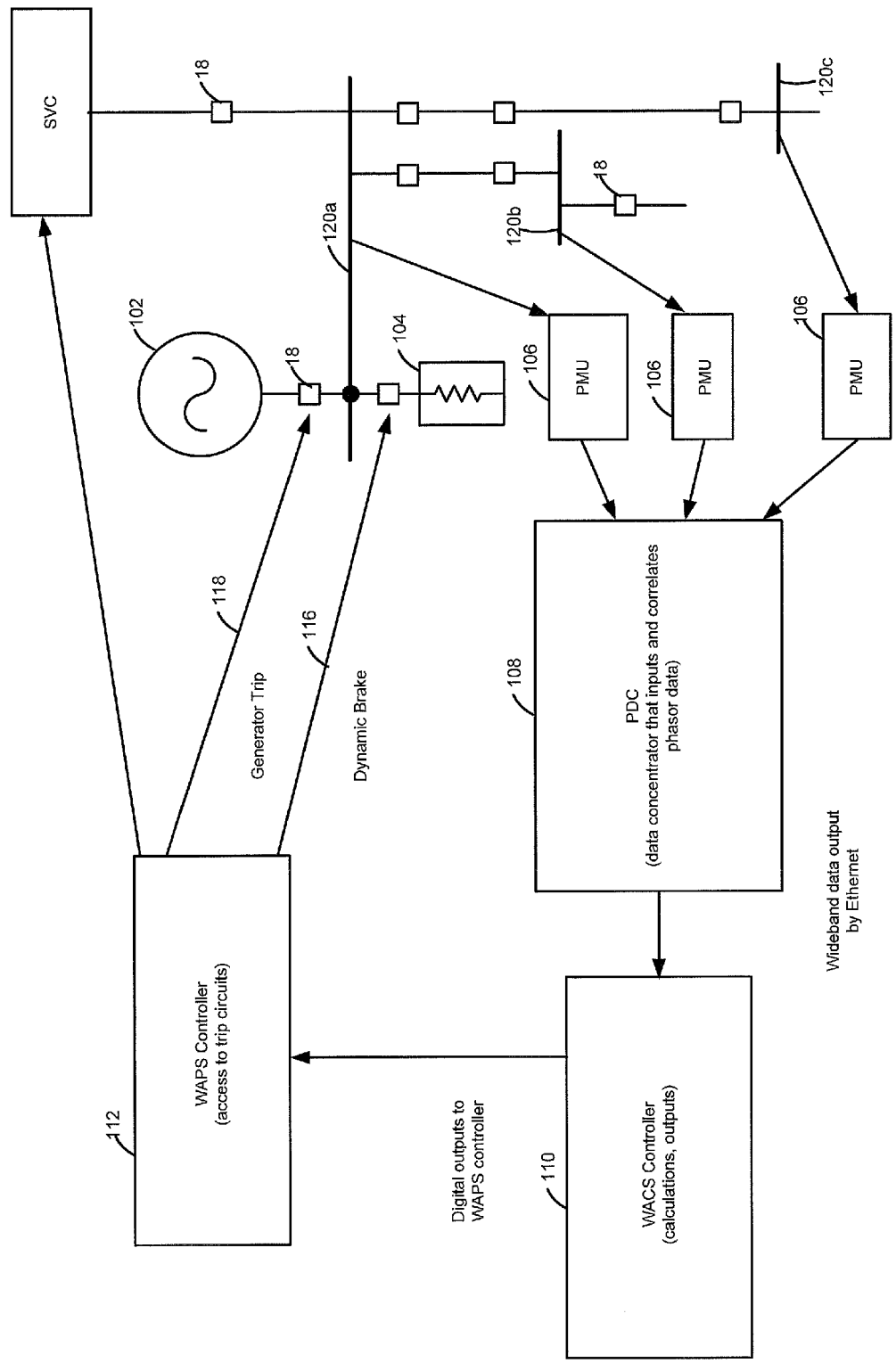
FIG. 2 is a prior art block diagram depicting a wide-area protection and control system using phasor measurement input.

FIG. 2 depicts a prior art wide-area protection and control system (WAPS and WACS) that uses phase measurement inputs. In this system, the power system data having a time component associated therewith is a phasor measurement. The system according to FIG. 2 includes a generator 102 that is protected by the WAPS controller 112. The WAPS controller 112 is capable of sending trip commands 118 to a circuit breaker 18 on one side of bus 120a, or close command to activate the power system dynamic brake and an open command to deactivate the power system dynamic brake 116 affecting load 104. This system consists of Phasor Measurement Units (PMUs) 106, Phasor Data Concentrator (PDC) 108, WACS Controller 110, and WAPS Controller 112. In this system, each PMU 106 acquires power system signals corresponding to the conductor that it monitors. For example, each PMU 106 may acquire power system signals (e.g., current and/or voltage signals) on its corresponding conductor 120a, 120b, or 120c. Each PMU 106 would create data (e.g., phasor values) from the analog signals acquired from the conductor 120a, 120b, and 120c, and transmit such data to the PDC 108. The phasor values could include angle and magnitude of the measured phases, and may be resampled before being transmitted to the PDC 108. PDC 108 then inputs, stores and correlates the phasor values. The resulting phasor values are then transmitted to a WACS 110, which performs control calculations and exports the binary results to a WAPS 112. The WAPS uses the binary results from the WACS 110 to perform protection functions such as tripping circuits.

As can be seen, the wide area protection according to this prior art arrangement requires several phasor measurement units and other IEDs (such as, for example, a PDC, WACS, WAPS, CPU, and the like) to provide protection to a wide area.

Another disadvantage to prior art wide area protection and control is the time required to issue a protection command. For example, in many wide area protection schemes that require phasor values to be collected and stored by a PMU 106 and sent to a PDC 108 before being processed by a WACS 110 and/or WAPS 112. Accordingly, there may be as much as 700 milliseconds of delay before a protective or control action is taken. The real-time controller of the present invention requires much less time to issue a protection command due to the fact that the system has fewer processing units and fewer communications channels between the IEDs. Moreover, the present invention does not require that power system information or data associated therewith be stored and retrieved from non-volatile memory.

Figure 3:
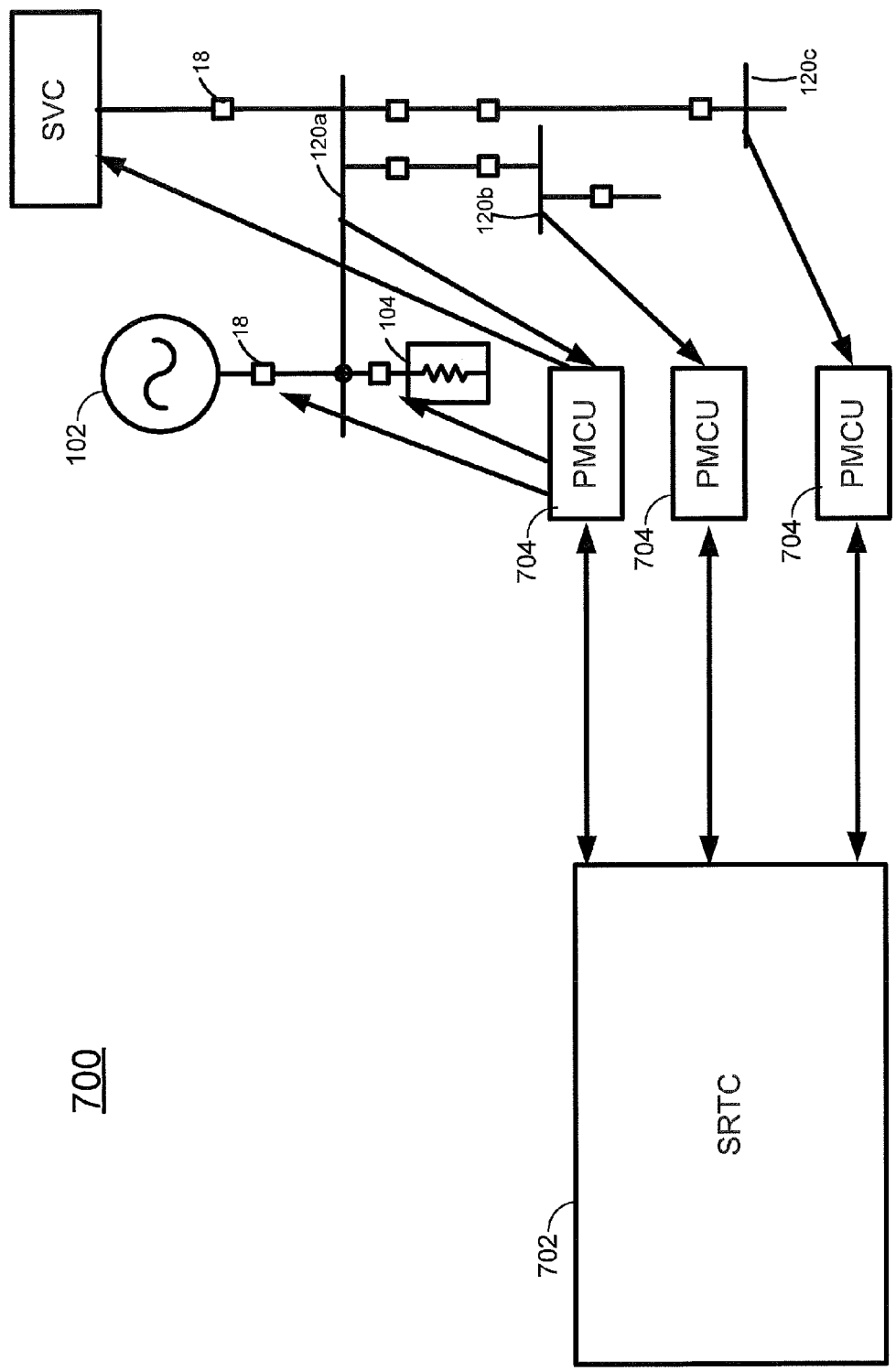
FIG. 3 is a block diagram illustrating an integrated wide area control and protection system that uses a synchrophasor real time controller (SRTC) according to an embodiment of the present invention.

FIG. 3 is a block diagram of a synchronized real time control network 700 using the real time controllers of the present invention. Although this embodiment as well as others described herein specifically refer to phasors or synchrophasors, the teachings of the present invention may be applied to other power system data or information associated therewith having a time component associated therewith. According to the embodiment of FIG. 3, the network 700 includes a single synchrophasor real time controller (SRTC) 702 that performs the functions of a PDC, WACS controller and WAPS controller, in communication with various PMCUs 704. According to this embodiment, the SRTC 702 may be a synchrophasor processor such as the SEL 3306, manufactured by Schweitzer Engineering Laboratories, Inc (Pullman, Wash.), enhanced with real time controller capabilities according to the present invention. The SRTC 702 receives analog signals and binary inputs from remote IEDs 704; correlates the received signals and inputs; and processes protection and control algorithms using a deterministic scheduling algorithm. Additionally, the SRTC 702 activates message commands based on the processed data using a communication protocol (e.g., SEL Fast Message Protocol or GOOSE message protocol such as that defined by IEC-61850). The remote IEDs 704 receive the message commands from the SRTC 702 to control and protect the power system.

Figure 4:
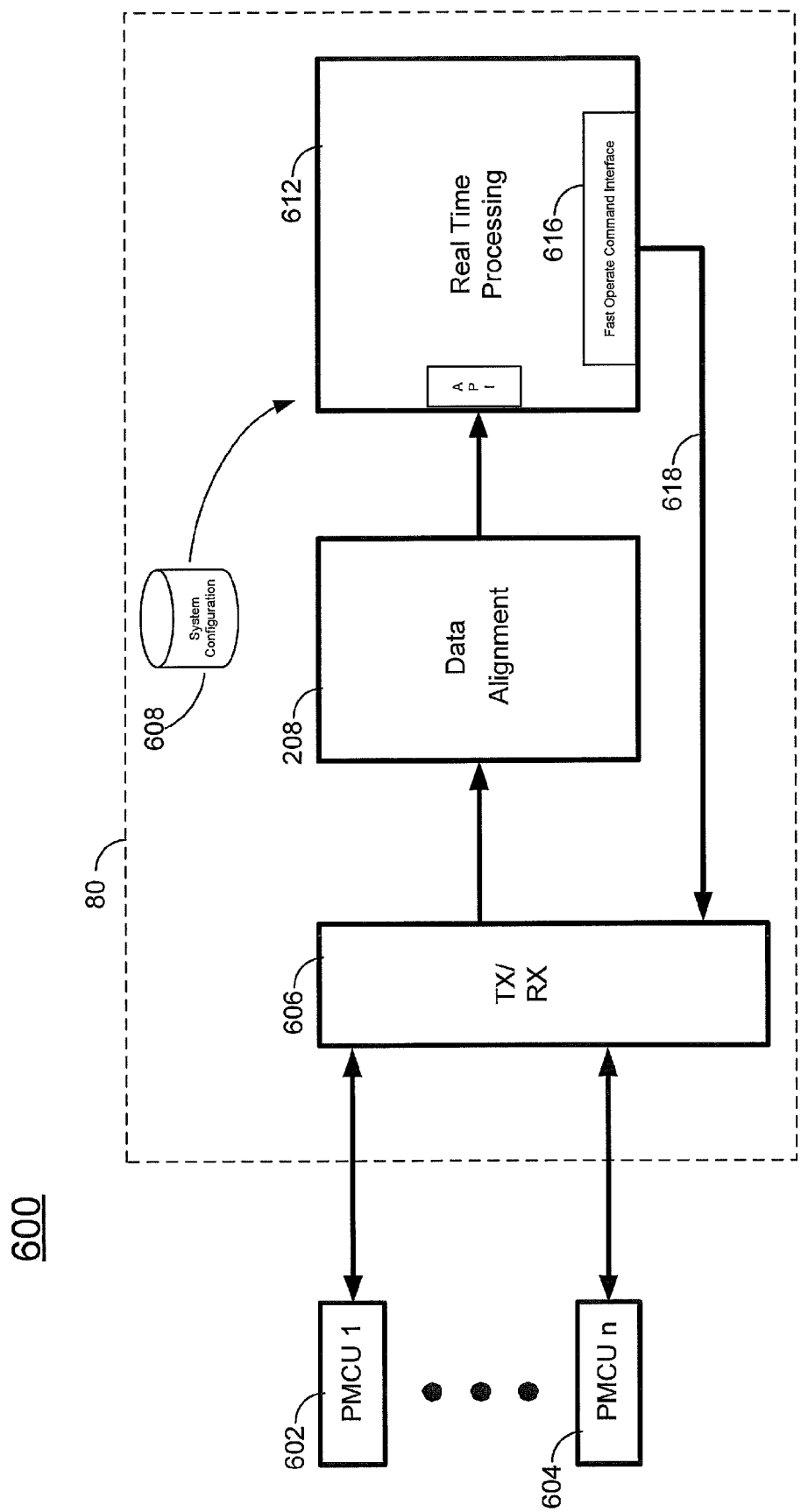
FIG. 4 is a block diagram illustrating a real time controller for wide area protection and control applications according to the present invention.
Figure 6:
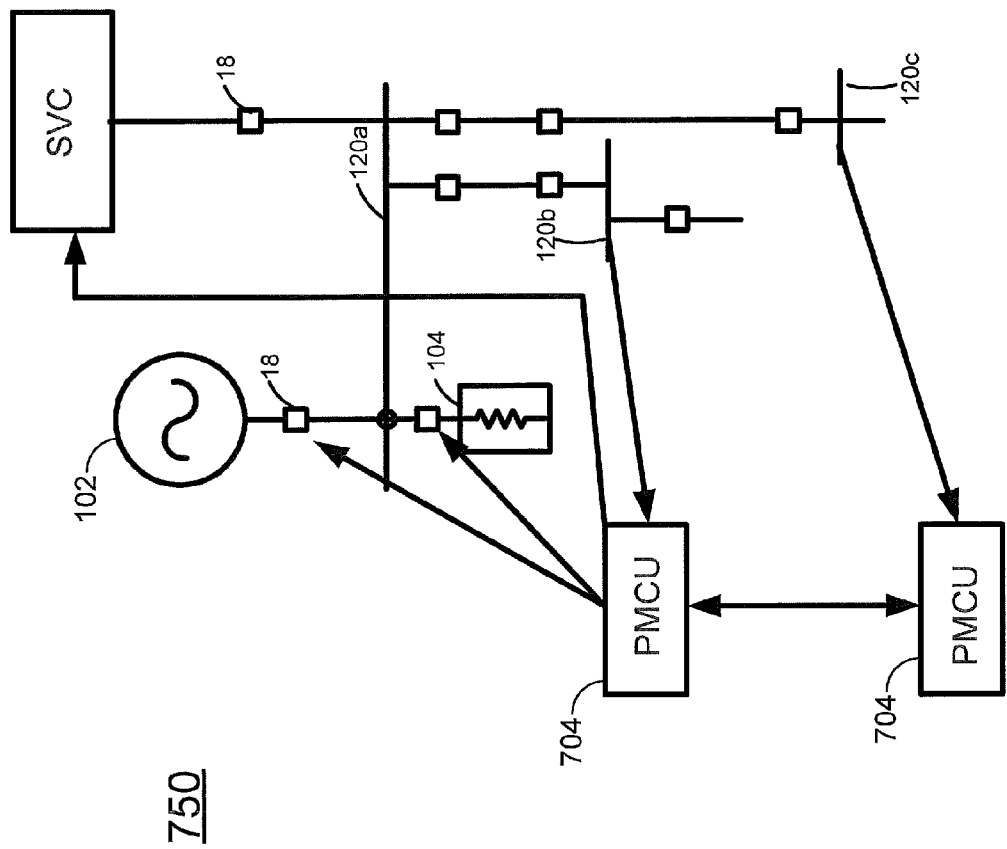
FIG. 6 is a block diagram illustrating an integrated wide area control and protection system that uses a synchrophasor real-time controller according to an embodiment of the present invention.

FIG. 4 is a block diagram of a synchrophasor real time control network 600 according to the embodiment of the present invention shown in FIG. 6. The synchrophasor real time control network 600 generally includes a local IED (e.g., PMCU 80) and a number of remote IEDs (e.g., PMCUs 602, 604). The remote PMCUs 602, 604 and local PMCU 80 communicate via a communications channel and transceiver 606 with transmit and receive capabilities. Although the communication channel is shown with separate paths, the implementation can be over a shared resource such as Ethernet. The local PMCU 80 further includes a resampling and data alignment block 208, which aligns the data according to the above descriptions. For synchronously generated data, the resampling operation is not required. Data alignment 208 can be achieved simply by comparing the signal time-stamps and then sorting such that all signals associated with a common time-stamp is presented to real time processing 612 together. For example, consider signals that are generated 120 times each second. The signals are generated such that for all IEDs in the system, the first signal corresponds to the exact one-second instant (using a time reference 508 common to all IEDs), the next signal corresponds to ¹⁄₁₂₀ of a second later, then ²⁄₁₂₀, and continuing to the last signal which is ¹¹⁹⁄₁₂₀ of a second after the one-second instant. This is then repeated for the next second. Signals that have been generated in this synchronous manner are described in the IEEE C37.118 standard. The signals enter real time processing 612 to create processed data as described above. Also available to the real time processor 612 is a System Configuration database 608. The configuration can then be obtained using a communication protocol (e.g., Fast Message protocol). The real time processor 612 may process the signals to create processed data and use various commands (e.g., Fast Operate commands 618) to send a control or protection message (e.g., Fast Operate Message) via an interface (e.g., Fast Operate Message Interface) to one or more remote PMCUs 602, 604 via the communications channel 606.

The methods and apparatuses described above may be used in systems to provide wide area protection, control, metering, and automation to electric power systems. The systems, apparatuses and methods herein described allow for faster response times to power system abnormalities because power system data (e.g., synchrophasor data) generated remotely are shared with the local IED (e.g., local PMCU), which can use the remote and the local power system information or data associated therewith to provide protection, control, metering, and automation to the electric power system without the need of intermediate processing devices (e.g., a phasor data concentrator or other processing unit between the PMCUs).

Figure 5:
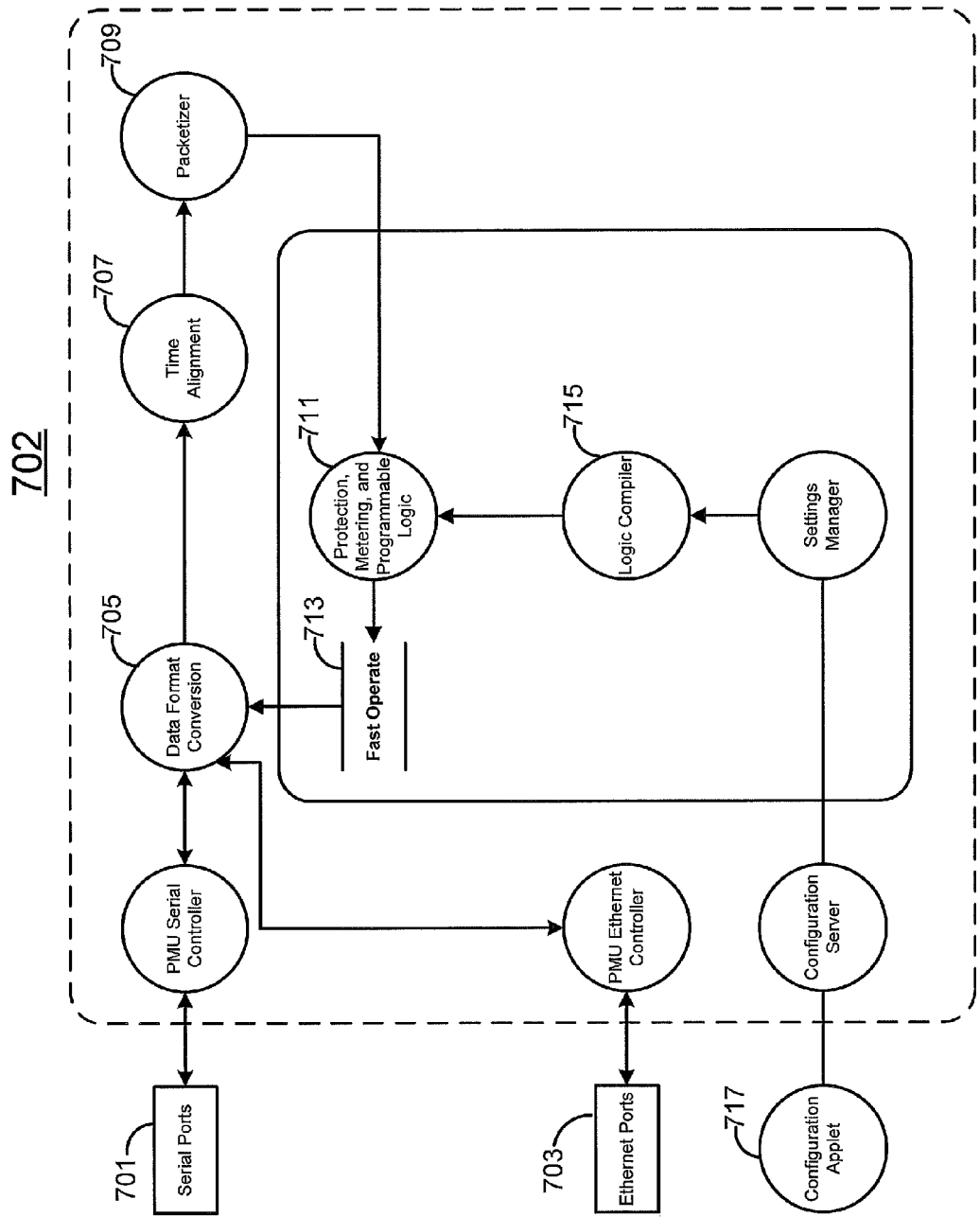
FIG. 5 is a diagram illustrating data flow in a synchrophasor real time controller according to an embodiment of the present invention.

FIG. 5 illustrates an example of data flow in the SRTC 702 of FIG. 3. Signals acquired from the power system (e.g., PMCU data) are adapted to be transmitted to the SRTC 702 through a communications port (e.g., either serial 701 or Ethernet ports 703), and into data format conversion 705. Once the signals have been converted to data, the data is time aligned 707 and packetized 709. The time alignment 707 may resample one stream of data to match the sampling of another stream of data. Time alignment uses the time-stamp information which is associated with the data. The time-stamp is referenced to a common time-base shared between all devices which are sending data. The SRTC 702 may process and time-align several streams of time-stamped data. The packetized data may be used by protection, metering, and programmable logic processor controller 711 that performs protection or control operations (e.g., math operations) on the data at one-millisecond intervals. The protection, metering, and programmable logic processor 711 may be programmed with conditions, which if met, require a message such as a fast operate message 713 to be sent to the PMCUs via the data format conversion 705 and the serial 701 and/or Ethernet ports 703.

The operations of the protection, metering, and logic processor 711 may further be user-programmable via a graphical user interface such as a configuration applet 717 and a logic compiler 715.

In one embodiment, the PMCU of the present invention includes synchronization and communications channel diagnostics to determine the health of the synchronized real time control network 700. The diagnostics may include predefined bits (such as SEL Relay Word Bits) that when set indicate synchronization status, communication channel status and a communications channel report that also includes latency measurements and the received data packet content.

FIG. 6 illustrates a block diagram of an embodiment of a synchronized real time control network 750 using the present invention. The real time controller is integrated into the PMCUs instead of being a separate unit. The PMCUs have been shown in FIG. 4. The PMCUs 704 share synchrophasor values with each other, and correlate the received data and process protection and control algorithms. Additionally, the PMCUs 704 activate commands based on the processed data using, for example, SEL Fast Message Protocol, to control and protect the power system. Although FIG. 6 shows two PMCU communicating with each other, the system can consist of multiple PMCU communicating with each other. The IED 300 shown in FIG. 9 describes operation for multiple sources of data.

Figure 7:
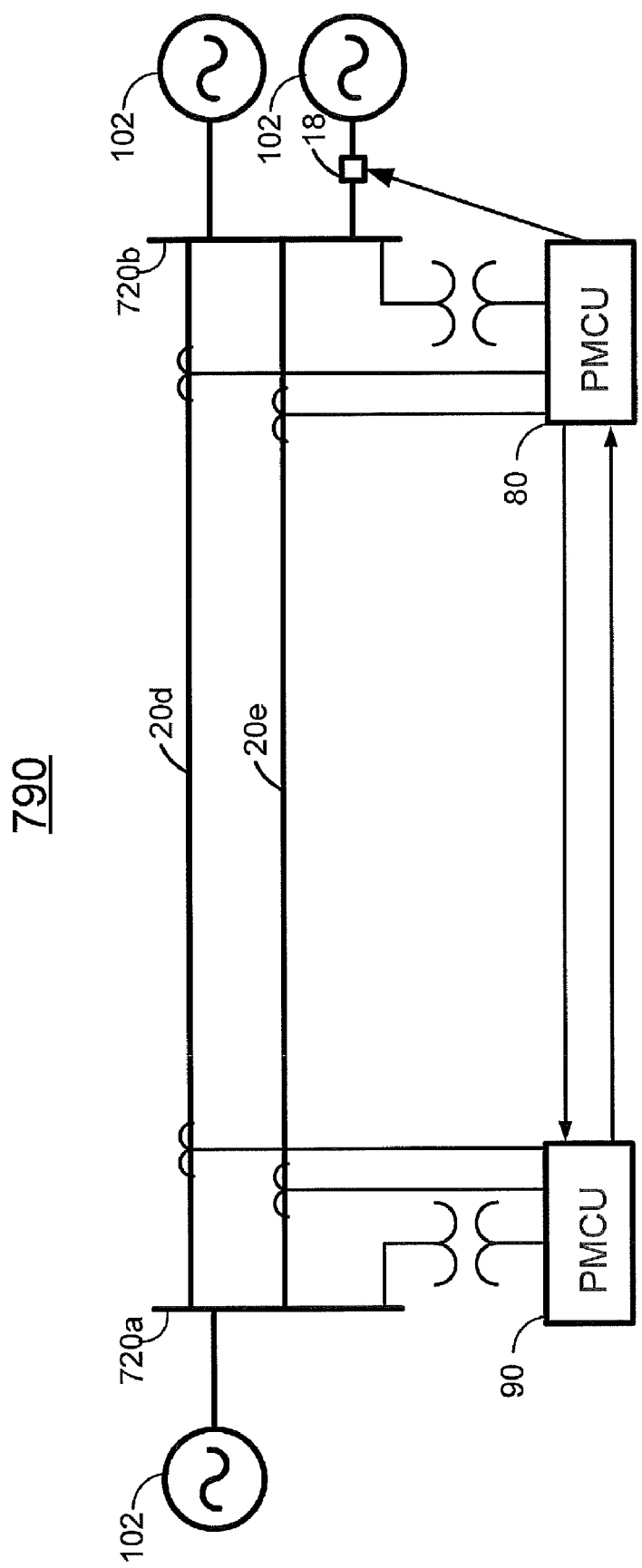
FIG. 7 is a block diagram illustrating an integrated wide area control and protection system that uses a synchrophasor real-time controller according to an embodiment of the present invention.

FIG. 7 illustrates a block diagram of an embodiment of a synchronized real-time control network 790 using the present invention. Various generators 102 on buses 720a and 720b are connected by electric distribution or transmission lines 20d and 20e. A local IED (in this case, a PMCU 80) is adapted to receive analog power system signals from bus 720b. Remote IED (which may be a PMCU 90) is adapted to receive analog power system signals from bus 720a. The local and remote IEDs 80 and 90 may operate according to any of the embodiments herein described. For example, local IED 80 may receive remote synchronized phasor values corresponding to the signals acquired at bus 720a by remote IED 90. Local IED 80 may generate local synchrophasor values corresponding to the signals acquired at bus 720b, and lines 20d and 20e; delay the local synchrophasor values to account for channel latencies for the communication of data from the remote IED 90; time align the local synchrophasor values with the remote synchrophasor values; and perform protection, control, metering, and/or automation functions on the electric power system accordingly. For example, if a comparison between the local and remote synchrophasor values corresponds with pre-selected conditions, local IED 80 may send a command to circuit breaker 18 to open, so as to shed a generator 102. The PMCU 80 and PMCU 90 are both individually connected to a common time reference, such as GPS.

Figure 8:
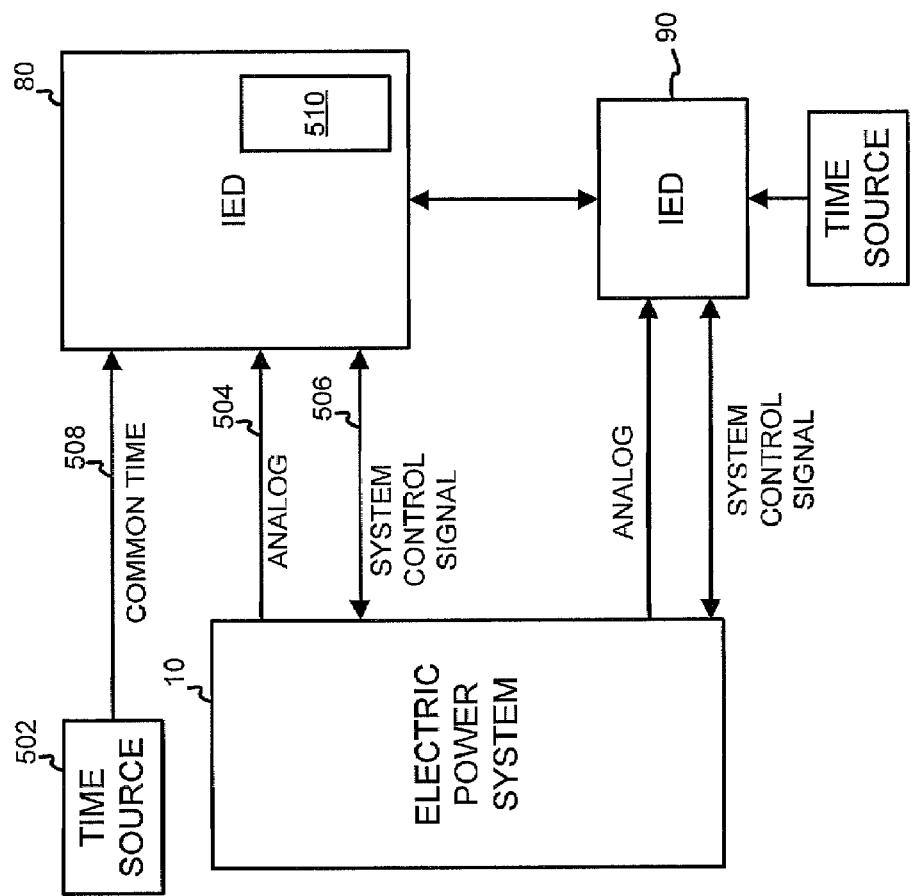
FIG. 8 illustrates an integration of the present invention with an electric power system.

In an embodiment, the local IED 80 of the present invention may include a time source as illustrated in FIG. 8. The time source can be external to IED 80, as shown in FIG. 8, or, in another embodiment, may be incorporated with IED 80. Accordingly, a time source 502 such as a GPS time source may be in communication with the local IED 80 such that functions involving a common time reference 508 may be performed in the IED 80. For example, the common time reference may be an absolute time reference. The local IED 80 may include a microcontroller 510 in which many of the functions of the IED 80 may be performed. In one embodiment, the microcontroller 510 includes a CPU, or a microprocessor, a program memory (e.g., a Flash EPROM) and a parameter memory (e.g., an EEPROM). As will be appreciated by those skilled in the art, other suitable microcontroller configurations may be utilized. Although this embodiment involves the use of microcontroller 510, it should be noted that in this embodiment and others presented and claimed herein may be practiced using an FPGA or other equivalent.

As shown in FIG. 8, the local IED 80 may also be in communication with the electric power system 10 such that the local IED 80 receives analog inputs 504 from the electric power system 10. The IED may also transmit control signals 506 to the electrical power system 10. As is known in the art, the control signals 506 may include, for example, trip commands, close commands, alarm commands, and the like.

Figure 9:
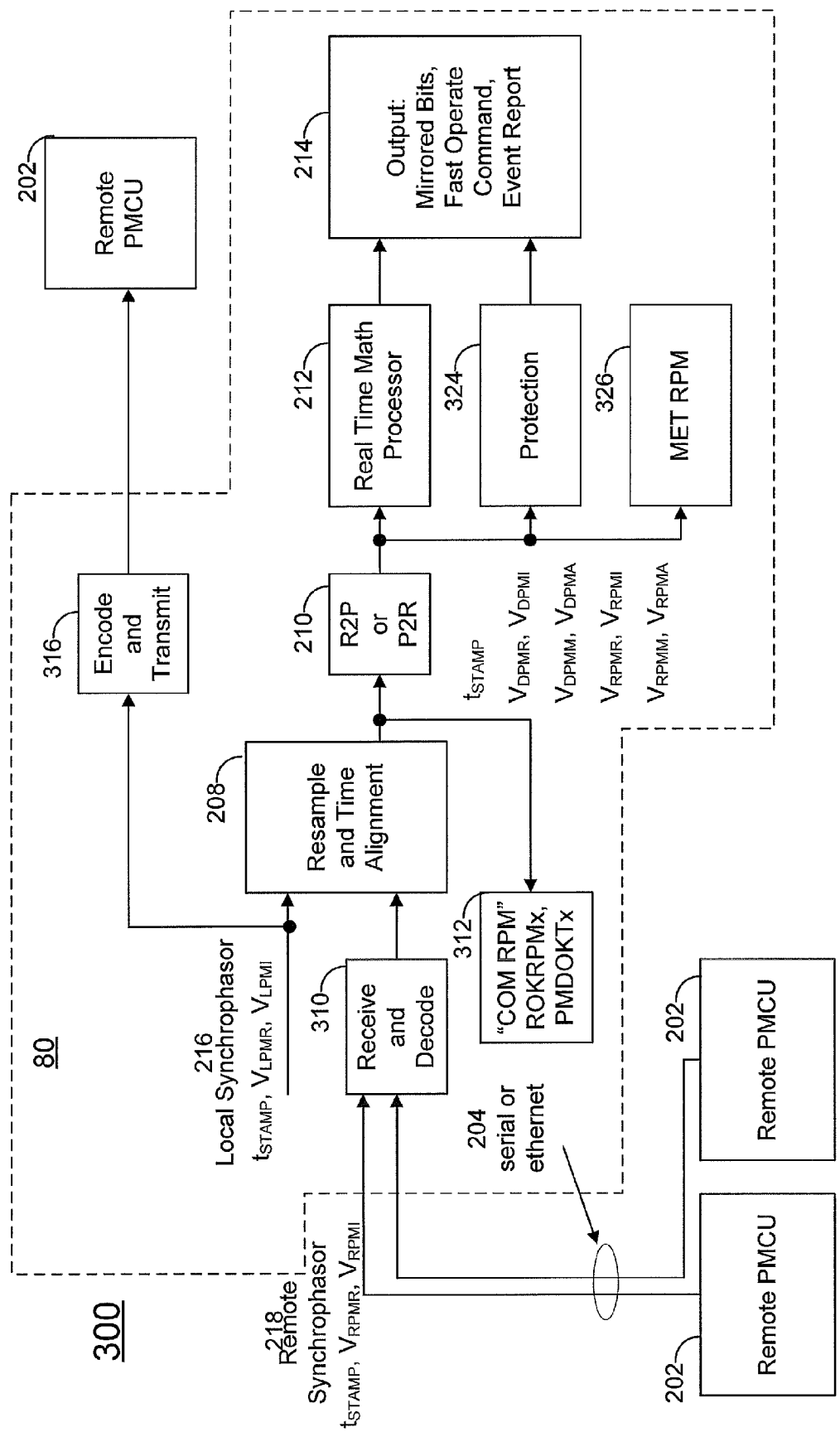
FIG. 9 is a functional block diagram of the present invention.

In an embodiment, a method for real time processing of the signals acquired from the power system is provided and illustrated generally at 300 in FIG. 9. For simplicity, this embodiment involves synchrophasors. In general any data which has been time-stamped according to a common time reference may be processed in the manner shown in FIG. 9. Accordingly, phasor representation may be communicated in rectangular coordinates, as real and imaginary components, of a single line phase. The phasor data may also be communicated using polar coordinates, as a magnitude and phase component. As seen in the diagram, the resample and time alignment block 208 receives inputs of both local synchrophasor values 216 and remote synchrophasor values 218. The local synchrophasor values 216 include a time stamp as well as real and imaginary components of the local synchrophasor voltage ($V_{LPMR}$, $V_{LPMI}$, respectively). In an embodiment, the local IED 80 receives remote synchrophasor values 218 in a message corresponding to a protocol such as C37.118-2005 (IEEE), Fast Message protocol, GOOSE (IEC-61850) and the like from the remote IEDs (e.g., PMCUs 202). The remote IEDs (e.g., PMCUs 202) may be devices such as the SEL-421 Protection, Automation and Control System, the SEL-451 Protection, Automation, and Control System, the SEL-311 Phase and Ground Distance Relay, the SEL 351 Directional Overcurrent and Reclosing Relay (all manufactured by Schweitzer Engineering Laboratories, Inc., Pullman, Wash.), a C37.118-compliant device, and the like.

The remote synchrophasor values 218 may include a time stamp as well as the real and imaginary components of the local synchrophasor voltage ($V_{LPMR}$, $V_{LPMI}$, respectively).

The local and remote synchrophasor values 216, 218 may further include frequency (or estimated frequency) of the sampled data, analog data, a rate of change of frequency, digitized analog data, digital data, magnitude and angle of phase currents, magnitude and angle of phase voltage, and so forth.

The remote synchrophasor values 218 originate from a remote IED (e.g., PMCU 202) such as a remote IED (e.g., the remote IED 90 of FIG. 1). The remote IED (e.g, PMCU 202) sends packets of data, depending on the type of communication lines used by the local and remote IEDs 80 and 90. For example, these packets of data may be in the form of serial or Ethernet packets 204. The local IED 80 receives and decodes the serial or Ethernet data packets. The remote synchrophasor values 218 include a time stamp as well as the real and imaginary phase measurements of the voltage ($t_{STAMP}$, $V_{RPMR}$, $V_{RPMI}$, respectively). In block 208, the remote synchrophasor values 218 and the local synchrophasor values 216 are time aligned. This time alignment may use the time stamp information from both the local and remote synchrophasor values 216 and 218. In the simplest case, all of the PMCUs generate synchrophasor data at the same rate and the local synchrophasor values 216 are delayed in time by a value chosen by the time delay of the remote IED (e.g., PMCU 202), channel 204, and Receive and Decode function 310. The local synchrophasor values 216 can be placed in volatile memory (for example using a RAM or FIFO) and when the remote synchrophasor values 218 are received then the time stamp of the remote synchrophasor values ($t_{STAMP}$ of 218) are compared against the time stamps stored for the local synchrophasor values ($t_{STAMP}$ of 216) to find a match. When the match is found then the associated $V_{LPMR}$ and $V_{LPMI}$ of 216 are taken from the RAM as delayed local values, $V_{DPMR}$ and $V_{DPMI}$, and used as values that correspond to the remote synchrophasor values 218. Similarly, when multiple remote PMCU 202 data must be time aligned then the local synchrophasor values 216 as well as all of the remote synchrophasor values 218 can be stored and the longest delay, or, the worst case expected delay, can be chosen as the reference $t_{STAMP}$ against which the other $t_{STAMP}$ values for the local and remote synchrophasors are compared.

Other methods of aligning the data can also be employed for block 208. For example, block 208 may resample the remote synchrophasor values 218 and the local synchrophasor values 216.

The local synchrophasor values 216 include a time stamp as well as the real and imaginary phase measurements of the voltage ($t_{STAMP}$, $V_{LPMR}$, $V_{LPMI}$, respectively). Along with being sent to the time alignment block 208, the local synchrophasor values 216 may also be sent to a remote IED (e.g., PMCU 202). Before communication to the remote IED (e.g., PMCU 202), the local synchrophasor values 216 may be encoded 316 and sent according to a communication protocol such as C37.118, GOOSE, SEL Fast Message Protocol, MirroredBits® or the like.

The data may then be converted from rectangular to polar coordinates, or polar to rectangular coordinates as needed in the rectangular/polar converter of block 210. The data that flows from the rectangular/polar coordinate converter 210 includes a time stamp ($t_{STAMP}$), and optionally a subset or all of rectangular (real and imaginary components) delayed local synchrophasors ($V_{DPMR}$ and $V_{DPMI}$), polar (magnitude and angle components) delayed local synchrophasors ($V_{DPMM}$ and $V_{DPMA}$), rectangular remote synchrophasors ($V_{RPMR}$ and $V_{RPMI}$), or polar remote synchrophasors ($V_{RPMM}$ and $V_{RPMA}$). This data then enters a real time math processor 212 which may function using a processing application such as, for example, SELMath, to output a message, control, or protection command 214. The processor 212 uses time-aligned data from local and remote PMCUs in order to perform protection, automation, control, and metering functions. The output message, control or protection command may be communicated in any of a number of protocols such as MirroredBits® (described in U.S. Pat. Nos. 5,793,750, 6,947,269, and US Patent Application Publication 2005/0280965, all of which are hereby incorporated by a reference), Fast Operate Command, or an Ethernet protocol. The output message, control, or command may further be in the form of an event report.

Data flowing from the Resample and Time Alignment block 208 may flow to a human machine interface (HMI) via a metering report 326 that may contain data such as that, described in more detail below, and in conjunction with FIG. 14.

Statistics regarding the reliability of the communicated synchrophasor data may be available in a report form, represented by block 312. The reliability of the communication channel may also be monitored by using single bit values such as ROKRPMx and PMDOKTx. The subscript "x" communicates from which PMCU the value indicates. For example, if x=1, the value is for PMCU 1.

The above synchrophasor real-time processor may also be described in terms of a synchrophasor real-time network. The synchrophasor real-time control network, shown in FIG. 9, includes one local IED 80, such as a PMCU and three remote IEDs 202, such as PMCUs that exchange synchronized measurements and commands through a communications network for real-time control, monitoring and protection applications. The PMCUs 80 and 202 transmit and receive synchronized measurement messages and command messages. After the PMCU decodes the messages, the local data is resampled 208 to match the rate of the received data, then the PMCU aligns the remote (e.g. $t_{STAMP}$, $V_{RPMR}$, $V_{RPMI}$) and local (e.g. $t_{STAMP}$, $V_{LPMR}$, $V_{LPMI}$) messages according to their common time stamp, $t_{STAMP}$. In order to align the local data with the remote data, the PMCU 80 delays the local data 216 to account for communications channel latency. The PMCU 80 creates the delayed local quantities (e.g. $t_{STAMP}$, $V_{DPMR}$, $V_{DPMI}$). The remote and delayed local quantities correspond to the values on the power system at a previous time equal to the acquisition time delay plus the channel latency. In this application, the maximum channel latency allowed is one third of a second. Table 1 illustrates an example of local and remote quantities available in the local PMCU after decoding and time alignment. These quantities are available to the Real Time Math Processor 212, internal protection algorithms 324, and synchrophasor metering (MET RPM) 326. The Real Time Math Processor 212 performs logic and arithmetic operations to implement protection and/or control schemes using synchrophasor values. Output from the Real Time Math Processor 212 and/or the protection algorithms 324 may be output to remote PMCUs 202. The local PMCU 80 may also output to the remote PMCU 202 estimated or measured frequency information, phasor values before resampling, analog quantities, and so forth, as discussed in more detail herein.

Table 1 illustrates synchrophasor values after decoding and time alignment. For simplicity, a single-phase voltage is listed in the table. However, the synchrophasor values can be any of the line voltages (VA, VB, or VC), current phases, (IA, IB, IC), derived values (V1, I1), neutral values (IN, VN), arbitrary computed values (e.g. 327*(VA+VB)), or any combination thereof.

TABLE 1

| Quantity | Description |
|---|---|
| $V1_{RPMR}$ | Real part of the remote voltage. |
| $V1_{RPMI}$ | Imaginary part of the remote voltage. |
| $V1_{RPMM}$ | Magnitude of the remote voltage. |
| $V1_{RPMA}$ | Angle of the remote voltage. |
| $V1_{DPMR}$ | Real part of the delayed local voltage. |
| $V1_{DPMI}$ | Imaginary part of the delayed local voltage. |
| $V1_{DPMM}$ | Magnitude of the delayed local voltage. |
| $V1_{DPMA}$ | Angle of the delayed local voltage. |

An example of an application of synchrophasor real time control is the calculation of the positive-sequence voltage at both ends of the transmission line 20b (see FIG. 1) and detection of when the angle difference exceeds a predefined threshold, whereupon a control or protection action may be taken. The PMCU may issue a Fast Operate command 214 when the PMCU detects a condition such as an angle difference of greater than 10 degrees. The Fast Operate command 214 may, for example, cause a breaker to open. The Total Phasor Measurement Data Okay (PMDOKTx) bit supervises the command to avoid misoperations when the synchronized measurements are not reliable. That is, if the synchronized measurements are not reliable, the PMDOKTx bit would not be set, and the Fast Operate command 214 would not be issued.

Figure 10:
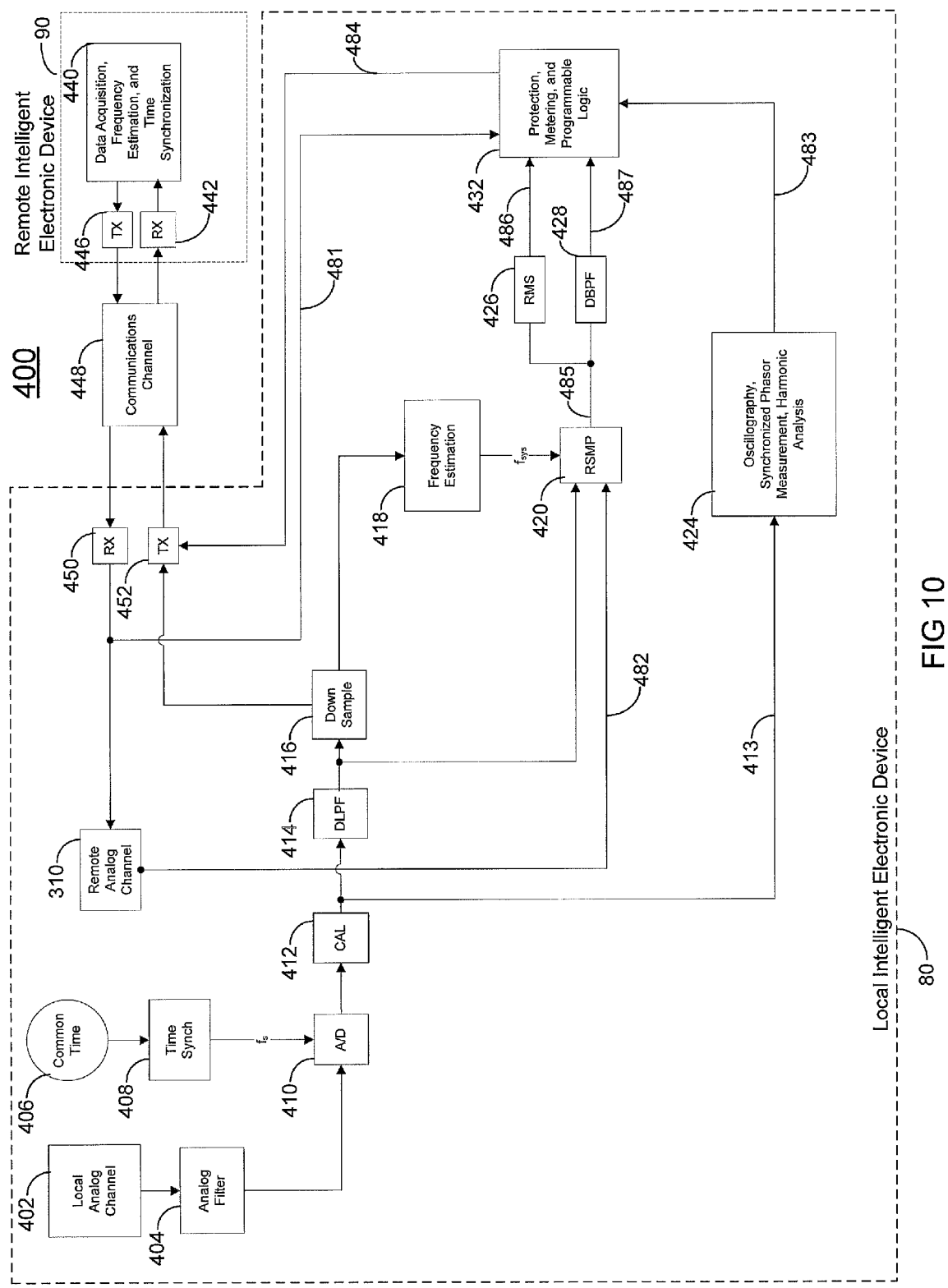
FIG. 10 is a block diagram of the present invention based on a fixed sampling frequency scheme.

Turning now to FIG. 10, illustrated is a functional block diagram of an embodiment of a system according to the present invention, indicated generally as 400. Although discussed as functional blocks, it should be understood that the IED (e.g., PMCU 80) may be implemented in hardware, software, firmware or a combination thereof. In this embodiment, the system produces power system data in the form of synchronized phasor values (measurements). These values are independent of power system frequency; therefore, they can be used for certain system-wide protection, automation, control or metering functions. In addition, the input signals may be resampled at multiples of the power system frequency to provide a typical range of protection functions, such as line distance protection and fault determinations.

FIG. 10 includes a local IED (e.g., PCMU 80), and a remote IED (e.g., PCMU 90). As mentioned above, these two IEDs (e.g., PCMU 80 and 90) communicate over a common communication channel 448, and may perform sampling, communication, control, and protection functions on an electrical power transmission or distribution system.

The local IED (e.g., PCMU 80) includes an element for providing an input analog signal 402. The element may include a plurality of transformer devices (voltage transformers/current transformers) that reduce the current and/or voltage values to a level appropriate for use in an IED (e.g., a microprocessor-based protective relay or PMCU).

The input analog signal 402 is applied to a low pass filter 404, the output of which is applied to an A/D converter 410. The acquired data is sampled at fixed intervals of time. The sampling signal is referenced to a clock signal. The clock signal may be provided by a time source 406, which provides an common time reference (e.g., an absolute time reference) to the local IED (e.g., PCMU 80) where time is synchronized to an common time standard such as UTC, and distributed using GPS, preferably formatted in an Inter Range Instrumentation Group time code standard (IRIG) signal for receipt by local IED (e.g., PMCU 80). Additional formats, distribution schemes, and time standards may also be utilized. The time source 406 submits a signal for synchronizing phasors based on Universal Time Coordinated (UTC). In order to obtain a more accurate phasor measurement, the synchronized signal is preferably accurate within about 500 ns of UTC. It is important to note that the phasors may be associated with a time component using any other time measurement means. Suitable forms of time communications links include IRIG-B, IEC 61588 Ethernet link or other such communications links.

The clock signal is applied to a time synchronization element 408, which decodes the message format of common time 406, compensates for temporary loss of common time 406, generates signals appropriate to control the A/D converter 410, and provides a time stamp of the sampling instance. The resulting sampled output from the A/D converter is applied to a calibration circuit 412, which accounts for any data acquisition errors that may occur in the data acquisition hardware, so that the data is aligned between IEDs 80 and 90. The output of the calibration circuit 412 contains the sampled data along with time stamps as to the sample instance according to common time 406. The data 413 may be provided at a relatively high sampling rate, for example, 8000 samples per second, is applied to a processing circuit 424 to produce synchronized data for conventional oscillography, synchronized phasor measurement, and harmonic analysis applications.

In addition, however, synchronized phasor values are determined from the power line input voltage and current values. The synchronized phasor output 483 of the circuit 424 may be independent of system frequency, and can be used in certain protection, control, metering and automation functions, along with user defined logic and mathematical operations carried out by the local IED (e.g., PCMU 80).

The algorithm in processing circuit 424 uses the input values, for example $V_A$, $V_B$, $V_C$, $I_A$, $I_B$, and $I_C$, with an common time reference, to produce synchronized data. The processor 424 decimates, i.e. decreases, the number of samples, dividing the number of samples by eight, to create voltage and current signals at, for example, 1000 (1 k) samples per second. Next, each input signal is separately multiplied by the reference signals $\cos(2\pi ft+\beta)$ and $\sin(2\pi ft+\beta)$ to create two output signals, where time t is common time reference, f is a fixed reference frequency (e.g. 50 Hz or 60 Hz), and $\beta$ is a further calibration adjustment for the particular hardware used. In the next step, the high frequency components of each multiplied signal is removed with a low-pass filter. The final result is the real and imaginary parts of the $V_A$, $V_B$, $V_C$, $I_A$, $I_B$, and $I_C$, phasors. In one embodiment the local IED (e.g., PCMU) is adapted to calculate these particular phasors every 50 milliseconds.

Next, the processor 424 uses the $V_A$ signal, with common time reference to produce the A-phase voltage synchrophasor ($V_{Async}$). The IED performs similar calculations for the other phasors. Each resulting synchrophasor or data is associated with a particular time stamp, referred to as time-sync. This time stamp is referenced to common time.

The positive-sequence quantities (e.g. $V_{1sync}$) are then computed from the three-phase current and voltage synchrophasors. Alternatively, Clarke components may be computed from the three-phase current and voltage synchrophasors or the time-aligned signals ($V_A$, $V_B$, $V_C$, $I_A$, $I_B$, and $I_C$). Both of these computations are described in U.S. Pat. Nos. 6,662,124 and 6,845,333.

The protection functions that use the synchronized phasor measurements, such as the synchronized positive-sequence phasor values, include current differential protection, in which current values from a local IED (e.g., PCMU 80), are used with current values from a remote IED (e.g., PCMU 90), to provide the protection function. A common time reference for the synchrophasors provides the ability to carry out such protection functions and make fault determinations. System-wide analysis capabilities as well as some protection functions are available from the processing circuit 424 alone. Examples of this capability include: accurate fault location; real-time line parameter estimation; real-time line loading estimation; real-time line temperature estimation; and the like.

Referring again to FIG. 10, the output of the calibration circuit 412 may also be applied to a digital low pass filter 414, the output of which is applied to a device 416 which resamples the data. The resampled data, along with synchrophasor data 484, is applied to the remote IED (e.g., PCMU 90) after encoding by transmitter 452 over a communications channel 448 at a rate which is suitable for the bandwidth of the communications channel. The resampled data output may also be applied to a conventional frequency estimator 418, which may be any of several known devices. Frequency estimator 418 will provide an estimate as to the actual frequency of the power line signal.

The output of frequency estimator circuit 418 is applied as the sampling signal $f_{sys}$ to a resampling circuit 420. One data input to resampler 420 is from a line from the output of the digital low pass filter 414 of local IED 80 (the local signal) and the other is from 310, which receives and decodes data from remote IED (e.g., PCMU 90).

The input signal is resampled at a frequency that is a selected multiple of the operating system frequency, e.g. $32 \cdot f_{sys}$ in the embodiment shown. Other multiples may be used. The local and remote resampled data, 485, are then applied through a digital bandpass filter 428 to the protection, control, metering, and programmable logic block 432.

The local resampled data is also processed at 426 to produce an RMS (root-mean-square) value. This RMS data is used for metering and protection applications for the IED in the protection, control, metering, and programmable logic block 432.

Another input to the protection, control, metering, and programmable logic block 432 is the output of the processor 424. The output from the processor 424, which includes phasor values from the electrical system 10 is used in the protection, control, metering, and programmable logic block 432 for protection and control functions, along with metering, automation, and user defined logic and mathematical functions, when themselves can be inputs into protection, metering, automation, and control functions within block 432. One advantage of the input from the processor 424 is that the protection and control functions may be performed without further delay that may result from the digital low-pass filter 414, resampling 416, frequency estimation 418, resampling 420, and RMS 426 functions.

Figure 11:
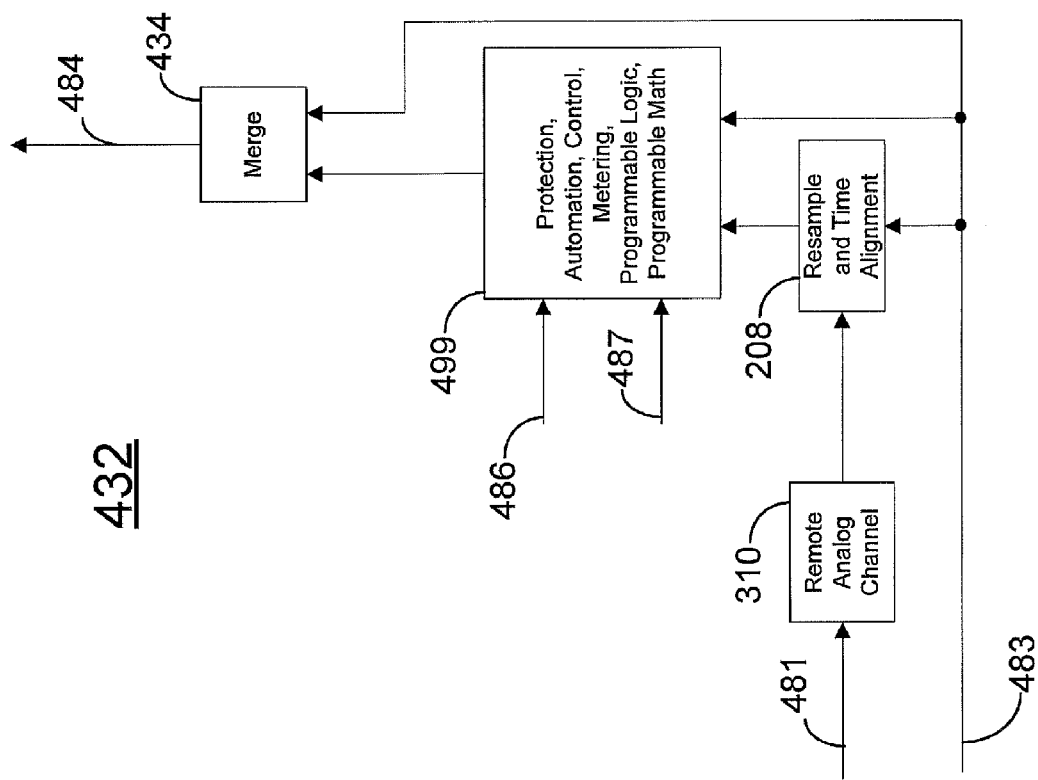
FIG. 11 is a block diagram of the inside of protection block 432.

FIG. 11 illustrates an embodiment of the Protection, Metering, and Programmable Logic block 432. The received signal 481 is decoded by 310. The output of the processing circuit 424, represented as synchrophasor data 483, and the data received from remote IED (e.g., PCMU 90) via the block, which receives and decodes remote data 310 are the inputs to an alignment function 208. The alignment function 208 serves to time align the remote data decoded by the remote analog channel 310 and the processing circuit 424 before the aligned data proceeds into the programmable logic circuit 499. As described above in conjunction with FIG. 4 and FIG. 9, the alignment function 208 may include resampling the output from processor 424 to time align the data with the received remote data. The programmable logic circuit 499 includes logic for protection, automation, control, metering, programmable logic and programmable math functions that may be performed by the local IED (e.g., PCMU 80), and produces a logic message which may include metering data, control data, automation data, or protection commands.

Data from the processing circuit 424 is also output to a merging operation 434, where it is merged with the logic message from the programmable logic circuit 499. The combined synchrophasor data 483 and data from 499 are then sent by way of a transmit line 484 and then encoded for transmission by 452 and the communications channel 448 to a receive operation 442 of the remote IED (e.g., PCMU 90). This allows for not only logic messages from protection, metering, and programmable logic circuit 432 to be communicated between the IEDs (e.g., PCMU 80 and 90), but also for synchrophasor values to be communicated between the IEDs (e.g., PCMU 80 and 90).

The electric power system information may be sampled based on a common time reference or predetermined intervals of time. As in FIG. 12, electric power system information may be sampled based on frequency of the power system. There are several methods for sampling electric power system information based on frequency. One such method is described below, as well as in US Patent Application Publication No. 2007/0086134, incorporated herein by reference.

Figure 12:
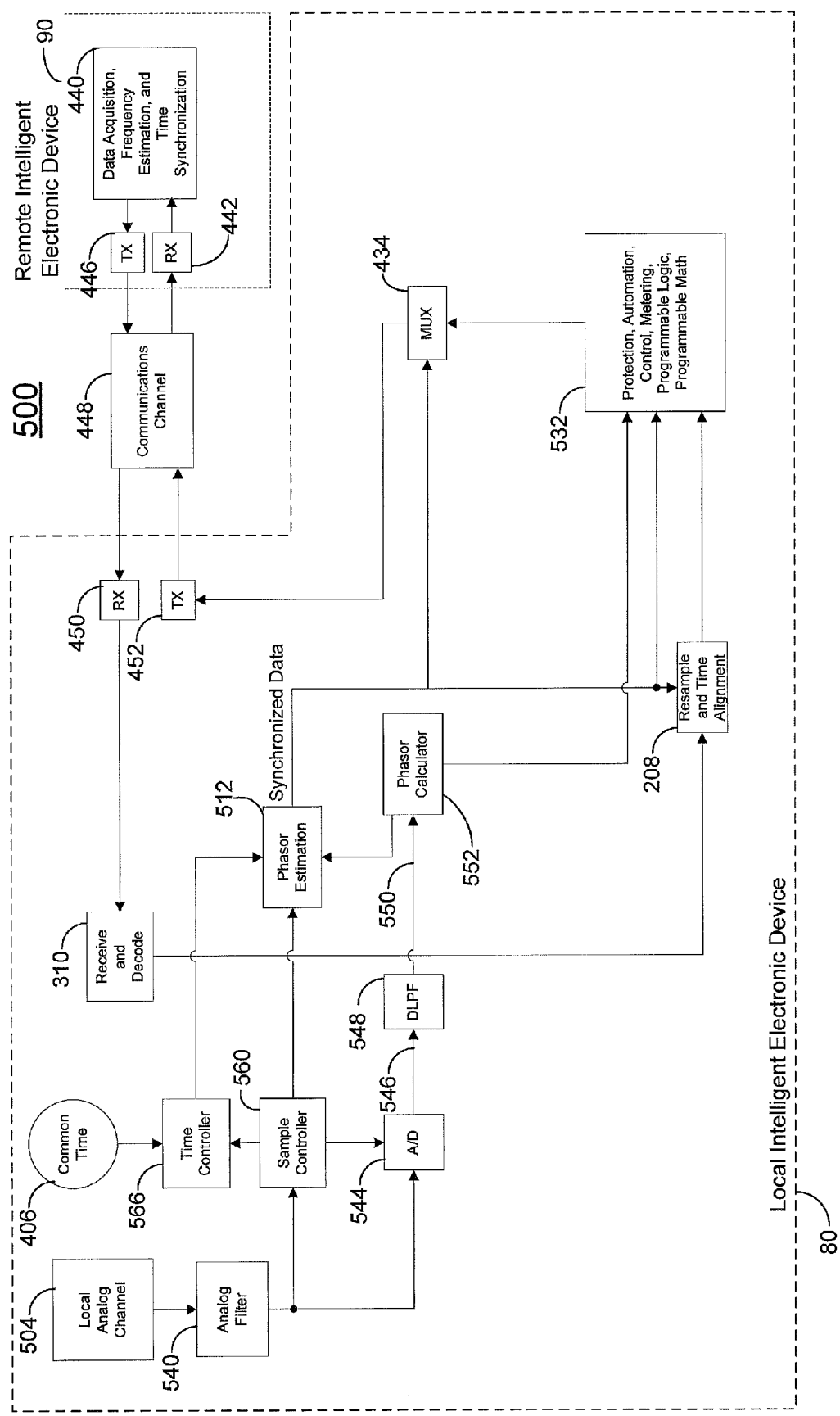
FIG. 12 is a block diagram of the present invention based on a variable sampling frequency scheme.

In an embodiment, the local IED (e.g., PCMU 80) may be configured to estimate synchronized phasors at predetermined time instants that are based on a common time reference and, in some embodiments, referencing to a phasor with predetermined phase and frequency. Referring to FIG. 12, the local IED (e.g., PMCU 80) may include an input configured to receive an input analog signal 504. The input analog signal 504, which, as described above, may be representative of one or more local voltages and/or one or more local currents, is received by local IED (e.g., PMCU 80) via voltage and/or current transformers connected to one or more phases of the power system 10.

A time source 406 may be further included to provide a common time reference to the local IED (e.g., PMCU 80) where time is synchronized to a common time standard.

In general, the input analog signal 504 received from the power system 10 may be filtered, multiplexed, sampled and digitized to form a signal of analog instantaneous samples suitable for use by a microcontroller (e.g., microcontroller 510 illustrated in FIG. 8) of the local IED (e.g., PMCU 80).

FIG. 12 is a functional block diagram 500 of the local IED (e.g., PMCU 80), according to yet another embodiment of the invention. Referring to FIG. 12, the local IED (e.g., PMCU 80) may include an analog filter 540 having an input for receiving the input analog signal 504 and an output for providing a filtered analog instantaneous signal to an analog-to-digital converter (ADC) 544. When received by the ADC 544, the filtered analog instantaneous signal may be sampled at a rate determined by a frequency of the input analog signal 504 to generate a sampled analog instantaneous signal 546. The series of filtered signal samples representative of the filtered analog instantaneous signal can be generated at a frequency associated with an integer multiple of the input analog signal 504.

The local IED (e.g., PMCU 80) may also include a digital filter 548 having an input for receiving the sampled analog instantaneous signal 546. In operation, the digital filter 548 may be adapted to reject unwanted signal characteristics such as harmonic distortion, thermal noise, and exponentially decaying DC offsets, from the sampled analog instantaneous signal 546 in order to provide a filtered signal 550 via its output. The filtered signal represents digitized, filtered instantaneous samples of the input analog signal 504, where the instantaneous samples of the input analog signal 504 are taken at a frequency of the input analog signal 504. A typical impulse response of the digital filter 548 is a full-cycle cosine waveform response or a half-cycle cosine waveform response.

The filtered signal 550 is provided to a phasor calculator 552 where a series of instantaneous phasors are calculated based on the filtered signal 550. Although not separately illustrated, the phasor calculator 552 may include a 90-degree phase shift function in order to provide a quadrature representation suitable for the calculation of magnitudes and phase angles. As noted above, for ease of subsequent calculations by the microcontroller 510, each of the time-synchronized phasors may be expressed in polar coordinate form to include a time-synchronized phasor magnitude and a time-synchronized phasor phase angle. Alternatively, a representation as a complex value may be utilized, depending on the nature of the Protection, Automation, Control, Metering, Programmable Logic, and Programmable Math block 532. For ease of discussion, both versions, the magnitude and phase combination and the real part imaginary part combination, are referred to herein as a time-synchronized phasor, or in general as a phasor. The time-synchronized phasor phase angle is referenced to, for example, (one of) the input analog signal(s) 504.

A Protection, Automation, Control, Metering, Programmable Logic, and Programmable Math block 532 may be configured to receive the time-synchronized phasors, and utilizing an algorithm or equivalent, perform the appropriate IED function (e.g., protection, automation, control, metering) to determine a status of the power system 10. Based on the determined status, the system control signal is provided to the multiplexer 434, and to other IEDs, as described above. The Protection, Automation, Control, Metering, Programmable Logic, and Programmable Math block 532 is also configured to utilize the synchronized phasors to perform power system functions, such as causing a breaker to trip.

As described above, the 532 block may also receive various data related to protection, monitoring, automation and control, and to receive synchronized phasors or other power system information or data from other IEDs coupled to the power system 10 via the communications channel 448, receive block 450, receive and decode block 310, and alignment function 208.

In addition to the signal processing functions described above, the local IED (e.g., PMCU 80) may include a sample controller 560 having an input for receiving the filtered analog instantaneous signal. The sample controller 560 may also include three outputs: a first output for providing a control signal stream to the ADC 544; a second output for providing a control signal stream to a time controller 566; and, a third output configured to provide a local frequency to a phasor estimation block 512. The sample controller 560 has no control input based on a common time reference, and therefore does not provide a control signal stream to the ADC 544 based on a common time.

In one embodiment the sample controller 560 operates to generate a series of the sampling instants at the local sampling interval rate, herein referred to as the control signal stream, where the sampling instants are an integer number multiple of the frequency of the input analog signal 504. As will be appreciated by one skilled in the art, the sampling instants may be based on other multiples of the frequency of the input analog signal 504. For ease of discussion, the control signal stream may be viewed as a pulse train of sampling instants. In general, however, the control signal stream may be configured in one of any number of signal configurations adapted to control analog multiplexers, gain circuits, sample and hold switches, programmable logic, and other devices.

In addition to receiving the control signal stream, the time controller 566 includes an input for receiving common time 406. The time controller 566 utilizes a common time reference to generate a series of instantaneous time values. Each instantaneous time value is representative of one decoded instant of time, and is updated periodically (e.g., once per second), depending on a common time standard and the nature of the implementation.

For example, if common time is formatted in using an IRIG-B protocol, a single bit stream of 100 pulses per second is transmitted. This means that 100 bits of data, representing one data frame of time information, are transmitted every second. Each one-second data frame contains information about the day of the year (1-366), hours, minutes, and seconds (e.g., Aug. 17, 2005 at 4:13.000000 PM). Accordingly, in one embodiment, the instantaneous time value is representative of one decoded instant of common time, and is updated once per second.

Using the time information provided by a common time reference, the time controller 566 also monitors the control signal stream to form the acquisition time value stream having a series of acquisition time values. Each acquisition time value is associated with one sampling instant of the analog input signal and is therefore associated with one time-synchronized phasor magnitude and one time-synchronized phasor phase angle. These values are output to phasor estimator 512 as shown in FIG. 12.

In general, the phasor estimation 512 may be configured to generate synchronized phasors indicative of the input analog signal 504. Several embodiments of phasor estimation 512 may be found in US Patent Application Publication No. 2007/0086134, referenced above. The synchronized phasors are magnitude adjusted and phase-aligned to common time, and in some embodiments they are further phase aligned to a phasor with predetermined phase and frequency. The phasor estimation 512 operates to generate the synchronized phasors in response to receipt of a series of the instantaneous phasor magnitudes, a corresponding series of time-synchronized phasor phase angles, the local frequency, the time-synchronized time values, and the acquisition time. Although described as functional blocks, it should be understood that the phasor estimation 512 may be implemented in hardware, software, firmware or a combination thereof.

The synchronized phasors from the phasor estimation 512 block and the received synchronized phasors from the receive and decode block 310 are time-aligned in block 208. The aligned synchronized phasors can then be used by 532 to provide the protection, control, and metering functions, as well as user defined logic and mathematical functions. The local synchronized phasors from the phasor estimation block 512 are also input to the protection, metering, and programmable logic block for instantaneous protection and control functions. Further, the synchronized phasors from the phasor estimation block 512 are multiplexed with an output from the protection, metering, and programmable logic block, and transmitted to the remote IED (e.g., PCMU 90) via the transmit block 452 and the communications channel. The data that may be transmitted to the remote IED may include local synchronized phasor values, local power system frequency, change in frequency with respect to time, analog quantities, digital (Boolean) bits, and so forth.

Figure 13:
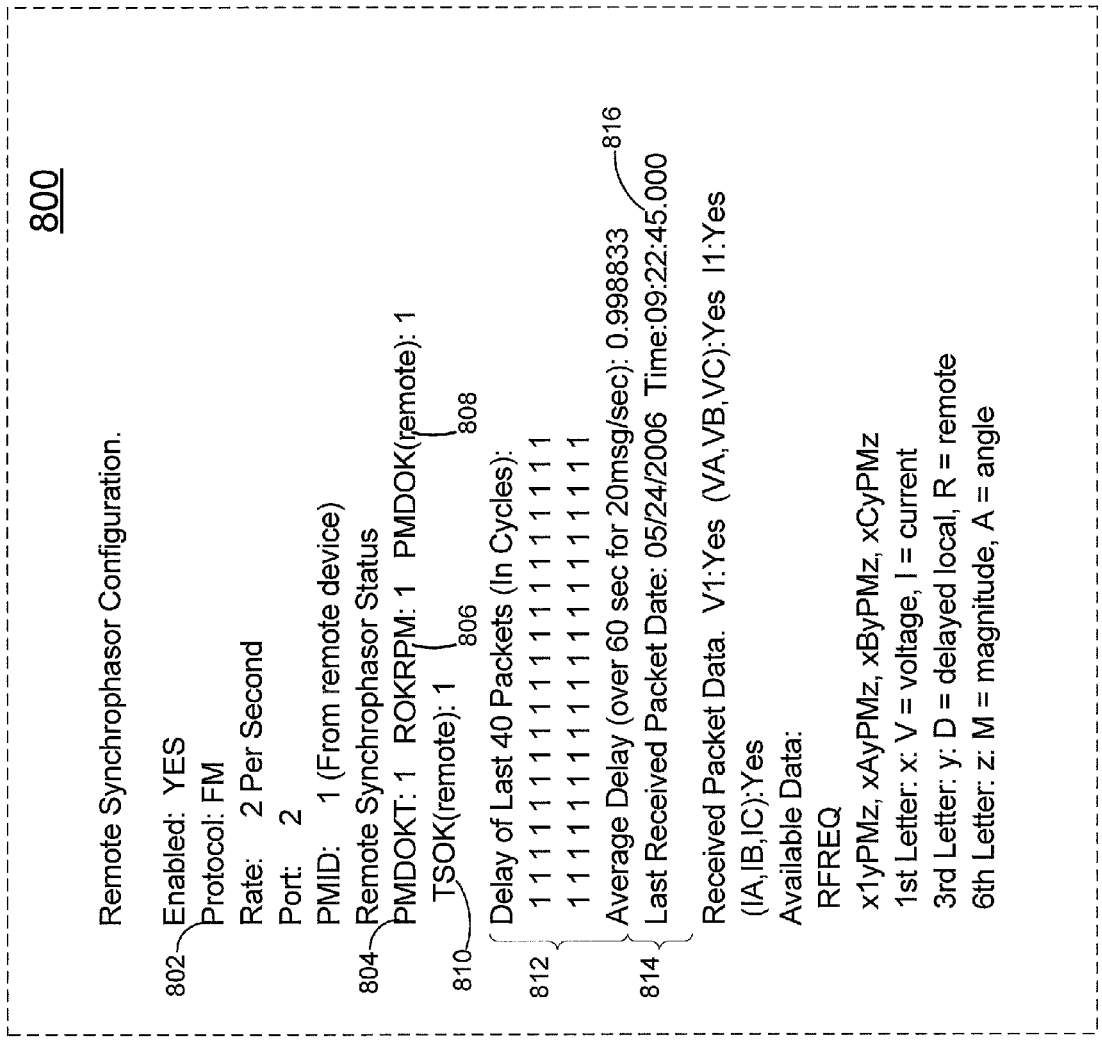
FIG. 13 is a communications channel report according to an embodiment of the present invention.

FIG. 13 illustrates a sample of a report showing a communications channel report according to one embodiment of the present invention. The communications channel report shows remote synchrophasor message confirmation, remote synchrophasor status 804, 806, 808, and 810, communications channel delay 812, and last received data packet and time 814. The communications channel delay 812 is calculated by subtracting the received remote synchrophasor time stamp 816 from the present local synchrophasor time stamp. The PMCU calculates the average delay using a first order infinite impulse response (IIR) filter with a time constant of 16 seconds. The Received Data Okay, Remote Phasor Measurement Relay Word Bit, ROKRPM, 806 indicates that all the following conditions are met: 1) the local PMCU is receiving data; 2) the received data message packet size is correct; 3) the received data is less that one third of a second old (this value will depend on the nature of the communication channel, the amount of buffering available, and the application); 4) the remote PMCU PMDOK Relay Word Bit is 1; and, 5) the remote PMCU TSOK Relay Word Bit is 1. The ROKRPM bit 806 tells the status of the channel. The Phasor Measurement Data Okay Relay Word Bit, PMDOK 808, indicates that the PMCU and synchrophasors are enabled. The Time Synchronization Okay Relay Word Bit, TSOK 810, indicates that the PMCU time synchronization value is accurate better than 500 ns. The remote PMDOK 808 and remote TSOK 810 are provided exactly as they are received in the Fast Message packet. The Total Phasor Measurement Data Okay Relay Word Bit, PMDOKT 804, is set when all the following conditions are true: 1) ROKRPM Relay Word Bit 806 is set; 2) local PMCU TSOK Relay Word Bit is set; and, 3) local PMCU PMDOK Relay Word Bit is set. This bit is included to provide security to the synchrophasor values. The synchrophasor values is valid only when PMDOKT=1.

The communications channel report further indicates the configuration of the IED 802. The report may include an indication that synchrophasor measurements are enabled and the protocol for transmitting synchrophasors (such as, for example, SEL Fast Message Protocol or GOOSE message protocol such as that defined by IEC-61850). In addition, the report may include a display of the rate at which messages are transmitted, the port, and the identification (PMID). This report may be available to a user upon command by the user. For example, the report may be available when the user enters a command into an HMI. Upon entering the command, the report may be displayed to the user via the HMI.

FIG. 14 illustrates a sample of a solicited synchronized phasor measurement report 900. The report 900 includes local synchronized phasor measurements, including phase and voltage magnitudes and angles, a time stamp, power system frequency, a rate of change of frequency, digital (Boolean) bits, analogs, and a serial number. The report also includes remote synchronized phasor voltage and current values, power system frequency, and digital (Boolean) bits. The report 900 may serve as a snapshot of the local and remote synchrophasor values at specific times across the power system. In one embodiment, a specific command may be given, such as the METER RPM TIME command, resulting in such a report 900 of synchronized phasor measurements at specific times. As with the communications channel report, this report may be requested and provided via an HMI. This report may also be configured to provide information at a specified instant in time. For example, the command may be configured to request information at a specific instant in time, and the report may display the power system information or data described above associated with that particular instant in time.

Figure 15:
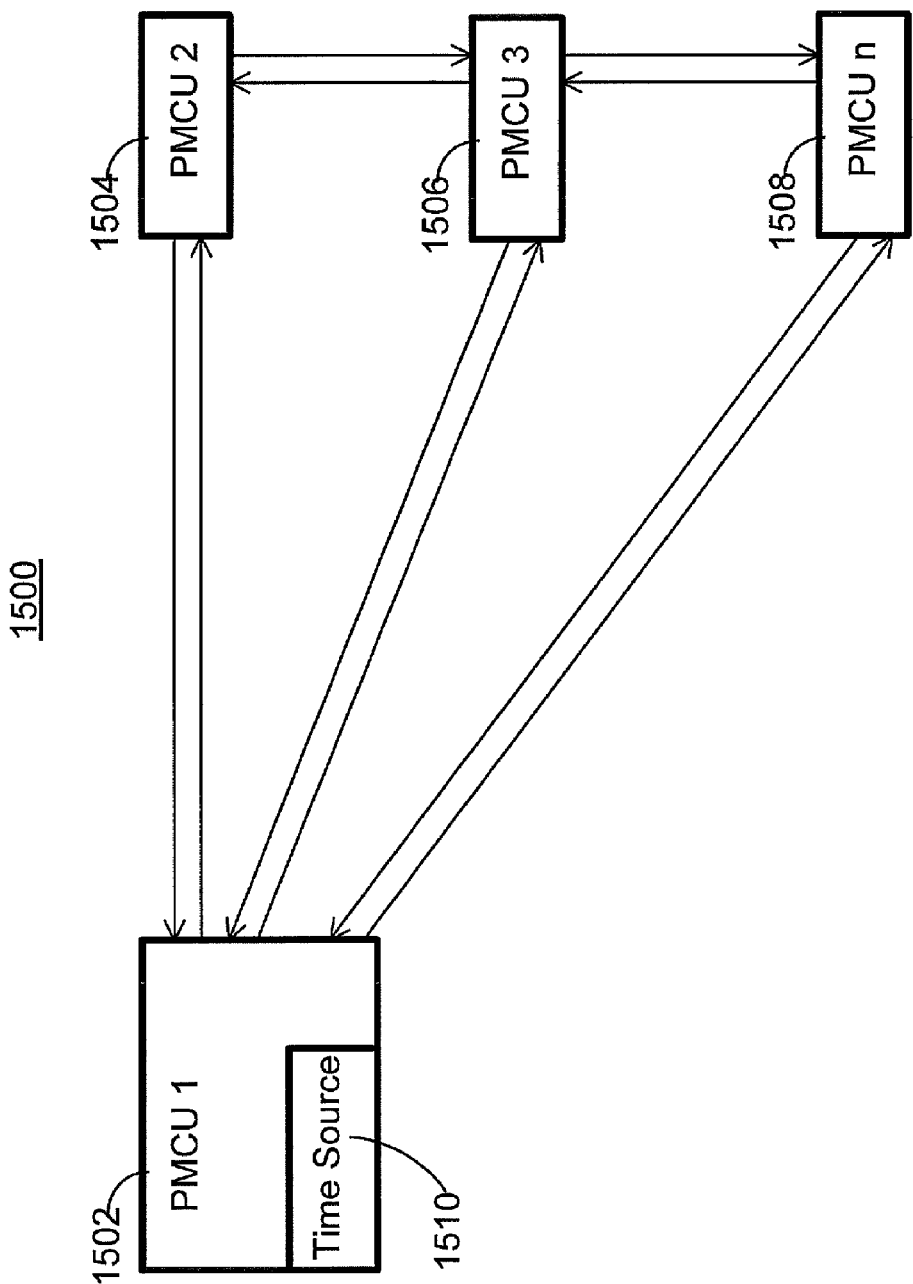
FIG. 15 is a block diagram of an embodiment of the present invention wherein one of the IEDs includes a common time reference.

FIG. 15 illustrates an embodiment of the present invention. One of the IED's (e.g., PMCU 1502) of the wide area network 1500 includes a time source 1510. The time source 1510 may be an internal clock associated with one of the IEDs (e.g., PMCU 1502). Each IED (e.g., PMCU's 1504, 1506, 1508) on the network may be adapted to receives time information from the IED (e.g., PMCU 1502) with the time source 1510. Accordingly, the time source may serve as a common time reference to all of the IED's (e.g., PMCU's 1504, 1506, 1508) within the wide area network 1500.

In an embodiment, the time source 1510 may be alternatively connected to absolute time (e.g., via GPS). In an embodiment, each IED or several of the IED's may have independent and synched time sources. Accordingly, if communication of the time is interrupted, another correct time may be communicated. In yet another embodiment, the IEDs may be configured to communicate time information only if communication to the common time reference is lost, and another time source is used for the common time among the IEDs.

While this invention has been described with reference to certain illustrative aspects, it will be understood that this description shall not be construed in a limiting sense. Rather, various changes and modifications can be made to the illustrative embodiments without departing from the true spirit, central characteristics and scope of the invention, including those combinations of features that are individually disclosed or claimed herein. Furthermore, it will be appreciated that any such changes and modifications will be recognized by those skilled in the art as an equivalent to one or more elements of the following claims, and shall be covered by such claims to the fullest extent permitted by law.

The invention claimed is:

1. A system for power system automation, control or protection based on the state of the power system at a specific instant in time using power system data having a time component associated therewith, comprising:

a remote IED associated with a remote location on a power line, the remote IED adapted to acquire remote power system signals at a specific instant in time, and which calculates remote power system data from the acquired remote power system signals, associates the remote power system data with a time stamp corresponding to the specific instant in time to produce time-stamped remote power system data, and transmits the time-stamped remote power system data; wherein a time delay is associated with any one of the acquisition of the power system signals, the calculation of remote power system data or the transmission of the time-stamped power system data; and a local IED associated with a location on a power line, the local IED adapted to acquire local power system signals at the specific instant in time, and which calculates local power system data from the acquired local power system signals, receives the time-stamped remote power system data, associates the local power system data with a time stamp corresponding to the specific instant in time to produce time-stamped local power system data, time-aligns the local power system data with the remote power system data by matching the time stamps of the local power system data with the time stamps of the remote power system data for the specific instant in time, and performs a real-time automation, control or protection operations based on the state of the power system at the specific instant in time using the time-aligned local power system data and remote power system data.

2. The system of claim 1, wherein the local IED transmits the time-stamped local power system data to the remote IED and the remote IED receives time-stamped local power system data, time-aligns the time-stamped local power system data with the time-stamped remote power system data by matching the time stamps of the local power system data with the time stamps of the remote power system data for the specific instant in time, and performs a real-time automation, control or protection operations using the time-aligned local power system data and remote power system data.

3. The system of claim 1, wherein power system data is phasor data.

4. The system of claim 1, wherein the local power system signal is voltage or current.

5. The system of claim 1, wherein the local IED further performs math operations on acquired local power system signal.

6. The system of claim 1, wherein the local IED is further adapted to provide a report containing one of the group consisting of: a configuration of the remote IED, a data status indicator, data, a channel latency, and combinations thereof.

7. The system of claim 1, wherein the remote IED is further adapted to transmit to the local IED power system information selected from a group consisting of IED configuration settings, substation configuration, and combinations thereof.

8. The system of claim 1, wherein the local IED is further adapted to provide a synchronized phasor measurement report containing one selected from the group consisting of: a time stamp, local power system data at the time of the time stamp, remote power system data at the time of the time stamp, power system frequency at the time of the time stamp, and combinations thereof.

9. The system of claim 1, wherein the local IED time delays the local power system data to account for latencies in communication of the remote power system data to the local IED.

10. A method for providing protection, control and monitoring to an electric power system based on the state of the power system at a specific instant in time, the method comprising the steps of:
acquiring remote power system signals at remote locations at the specific instant in time;
calculating remote power system data from the acquired remote power system signals;
associating the remote power system data with a time value corresponding to the specific instant in time to produce time-stamped remote power system data;
transmitting the time-stamped remote power system data to a local location; wherein a time delay is associated with any one of the acquiring, calculating, associating or transmitting steps;
receiving the time-stamped remote power system data at the local location;
acquiring local power system signals;
calculating local power system data from the sampled local power system signals;
associating the local power system data with a time value corresponding to the specific instant in time to produce time-stamped local power system data;
time-aligning the time-stamped local power system data with the time-stamped remote power system data for the specific instant in time by matching the time-stamps of the local power system data with the time-stamps of the remote power system data for the specific instant in time; and
performing real-time automation, protection or control functions based on the state of the power system at the specific instant in time using the time-aligned local power system data and remote power system data.

11. The method of claim 10, further comprising the step of: transmitting the time-stamped local power system data to the remote location.

12. The method of claim 10, wherein power system data is phasor data.

13. The method of claim 10, further comprising the step of time delaying the local power system data to account for latencies in transmitting the time-stamped remote power system data to the local location.

14. The method of claim 10, wherein the local power system signals are voltage or current signals.

15. The method of claim 10, further comprising the step of performing math operations on the acquired local power system signals.

16. The method of claim 15, wherein the math operations are user-defined.

17. An apparatus for providing protection, monitoring and control for an electric power system based on the state of the power system at a specific instant in time, the apparatus comprising:
an acquisition circuit for obtaining local analog signals from an electric power system at a specific instant in time;
a sampling circuit for sampling the local analog signals;
a communication channel for transmitting messages containing local power system data calculated from the local analog signals to a remote device;
a communication channel for receiving messages containing remote power system data for the specific instant in time from the remote device; wherein a time delay is associated with any one of the obtaining, sampling or communication of power system data;
a time alignment function for time aligning the local power system data with the remote power system data for the specific instant in time, and
a real-time operation function for providing protection, automation, metering, or control of the power system based on the time aligned local power system data and remote power system data.

18. The apparatus of claim 17, wherein the power system data is phasor data.

19. The apparatus of claim 17, further comprising a microcontroller for performing math operations on sampled local power system signals.

20. The apparatus of claim 19, wherein the math operations are user-defined.

21. The apparatus of claim 17, further comprising a time delay to delay the local power system data to account for latencies in the communication channel.

22. The apparatus of claim 17, wherein the apparatus associates the local power system data with a time stamp to produce time-stamped local power system data, and transmits the time-stamped local power system data to another apparatus.

23. A system for power system automation, control or protection based on the state of the power system at a specific instant in time using power system data having a time component associated therewith, comprising:
a plurality of IEDs associated with locations on a power line, the plurality of IEDs adapted to acquire power system signals at a specific instant in time, and which calculate power system data from the acquired power system signals for the specific instant in time, associate the power system data with a time stamp corresponding to the specific instant in time to produce time-stamped power system data, and transmit the time-stamped power system data; wherein one of the IEDs has a time delay associated therewith; and
a real-time controller adapted to receive the time-stamped power system data from the plurality of IEDs, time-aligns the time-stamped power system data for the specific instant in time by matching the time stamps of the IEDs for the specific instant in time, performs a real-time automation, control or protection operations based on the state of the power system at the specific instant in time using the time-aligned power system data, and transmits messages associated with results of the automation, control or protection operations to at least one of the plurality of IEDs.

24. The system of claim 23, wherein the power system data is synchrophasor data.

\* \* \* \* \*